United States Patent
Cho et al.

(10) Patent No.: US 12,013,425 B2
(45) Date of Patent: Jun. 18, 2024

(54) ELECTRIC DISASTER PREEMPTIVE DETECTION AND PREVENTION SYSTEM USING IoT TECHNOLOGY

(71) Applicants: Jin Young Cho, Gwangju (KR); Hyun Teak Cho, Seoul (KR); DAWON DNS CO., LTD., Gwangju (KR)

(72) Inventors: Jin Young Cho, Gwangju (KR); Hyun Teak Cho, Seoul (KR)

(73) Assignees: Jin Young Cho, Gwangju (KR); Hyun Teak Cho, Seoul (KR); DAWON DNS CO., LTD., Gwangju (KR)

( * ) Notice: Subject to any disclaimer, the term of this patent is extended or adjusted under 35 U.S.C. 154(b) by 0 days.

(21) Appl. No.: 17/707,705

(22) Filed: Mar. 29, 2022

(65) Prior Publication Data

US 2022/0221499 A1    Jul. 14, 2022

Related U.S. Application Data

(63) Continuation of application No. PCT/KR2020/009645, filed on Jul. 22, 2020.

(51) Int. Cl.
  *G01R 31/08*    (2020.01)
  *G01R 19/165*   (2006.01)
  (Continued)

(52) U.S. Cl.
  CPC ........... *G01R 31/08* (2013.01); *G01R 19/165* (2013.01); *G01R 31/52* (2020.01); *G01R 31/58* (2020.01); *G08B 21/18* (2013.01)

(58) Field of Classification Search
  CPC ...... G01R 31/08; G01R 19/165; G01R 31/52; G01R 31/58; G01R 19/2513; G01R 27/08;
  (Continued)

(56) References Cited

U.S. PATENT DOCUMENTS

| | | |
|---|---|---|
| 2012/0283890 A1 | 11/2012 | Fu et al. |
| 2013/0286521 A1 | 10/2013 | Park |
| 2016/0099569 A1* | 4/2016 | Rilling ...................... H02J 3/38 324/424 |

FOREIGN PATENT DOCUMENTS

| | | |
|---|---|---|
| KR | 10-2012-0024081 A | 3/2012 |
| KR | 10-1127672 B1 | 3/2012 |
| KR | 10-2017-0027829 A | 3/2017 |

OTHER PUBLICATIONS

International Search Report issued in PCT/KR2020/009645; dated Nov. 25, 2020.

* cited by examiner

*Primary Examiner* — Farhana A Hoque
(74) *Attorney, Agent, or Firm* — Studebaker & Brackett PC

(57) ABSTRACT

Disclosed is a power control system for preemptive detection and prevention of electric disasters including a feed end that supplies power, a receiver end that receives the power from the feed end through a line, a power control device that calculates at least one of a loss power value, a leakage current value, a voltage drop value, and an impedance value based on a voltage value and a current value, which are measured at each of the feed end and the receiver end, detects whether the line is abnormal, by comparing the calculated at least one value with a corresponding predetermined threshold and identifying a change in electrical properties, and controls the power supplied to the receiver end when it is detected that the line is abnormal.

20 Claims, 22 Drawing Sheets

(51) Int. Cl.
*G01R 31/52* (2020.01)
*G01R 31/58* (2020.01)
*G08B 21/18* (2006.01)

(58) Field of Classification Search
CPC .. G01R 21/133; G01R 27/26; G01R 31/1272; G08B 21/18; H02H 1/00; H02H 3/12; H02H 3/28; H04L 65/40
See application file for complete search history.

FIG. 4
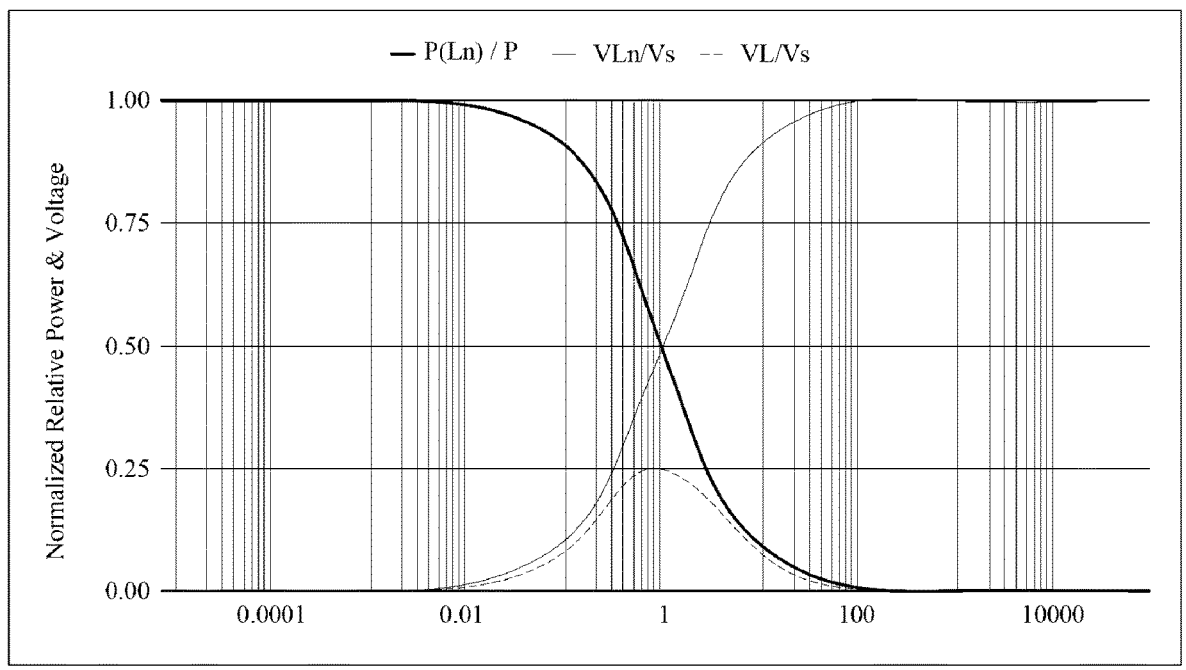
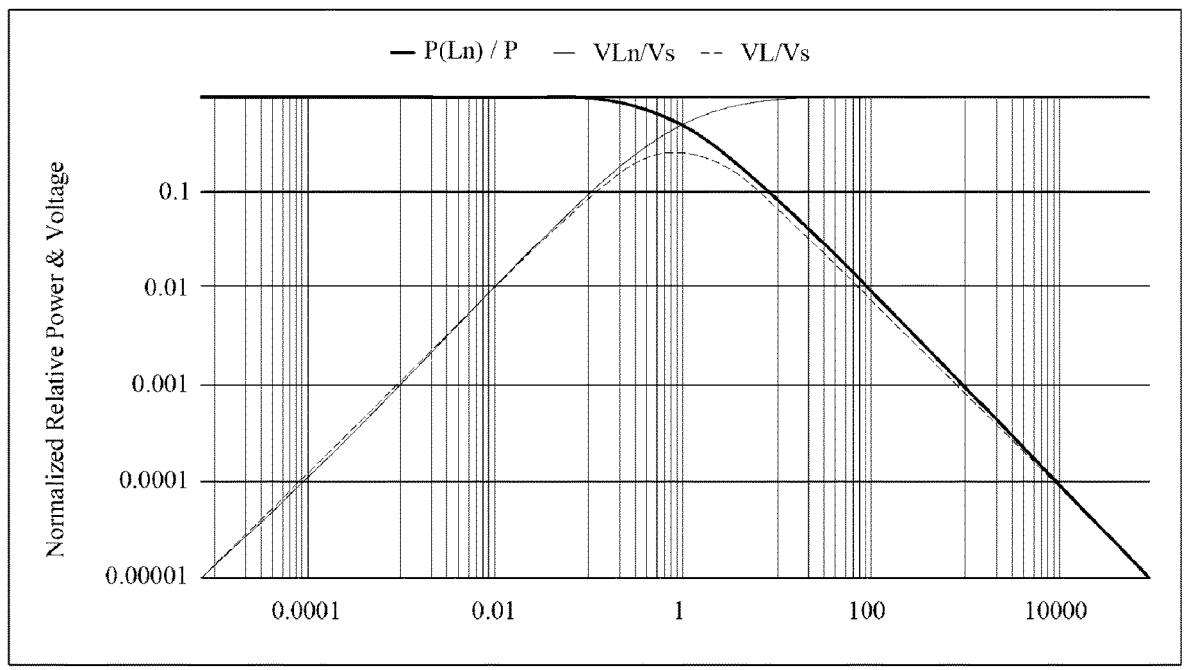

Relative Line Resistance RLn/RL

FIG. 7
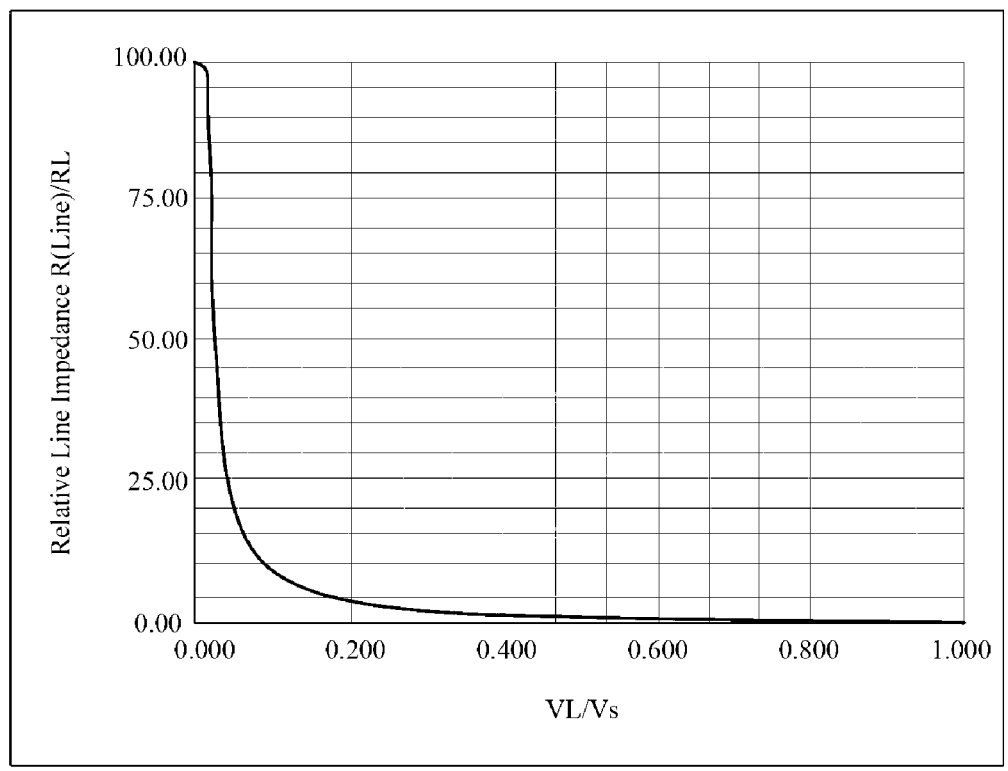
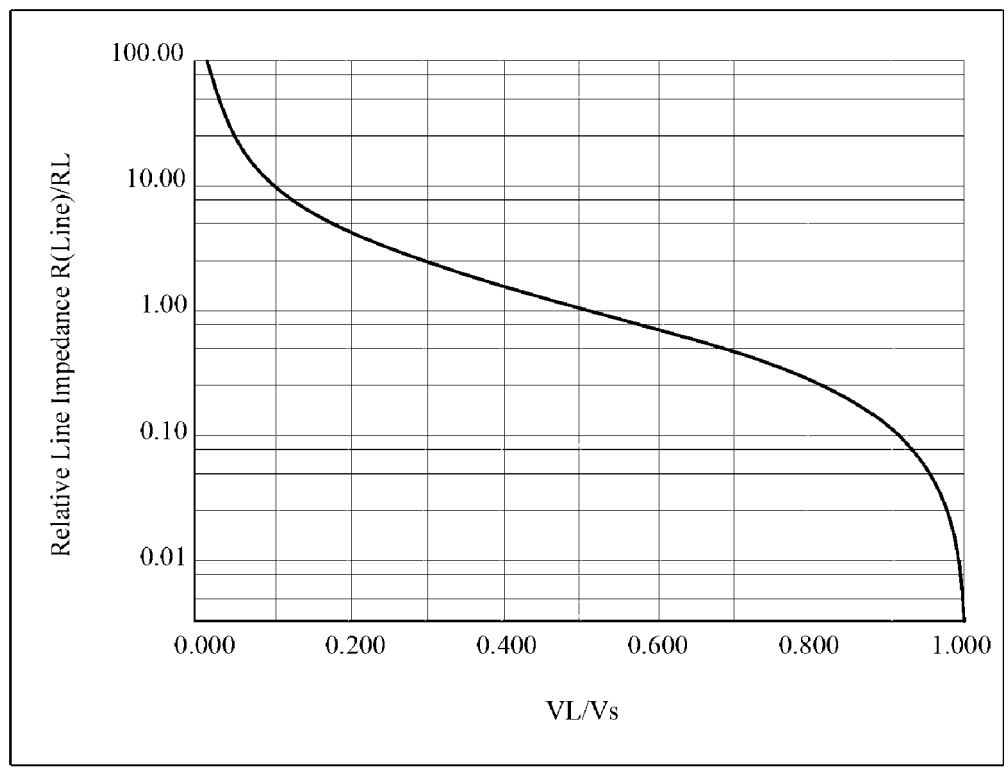

FIG. 9
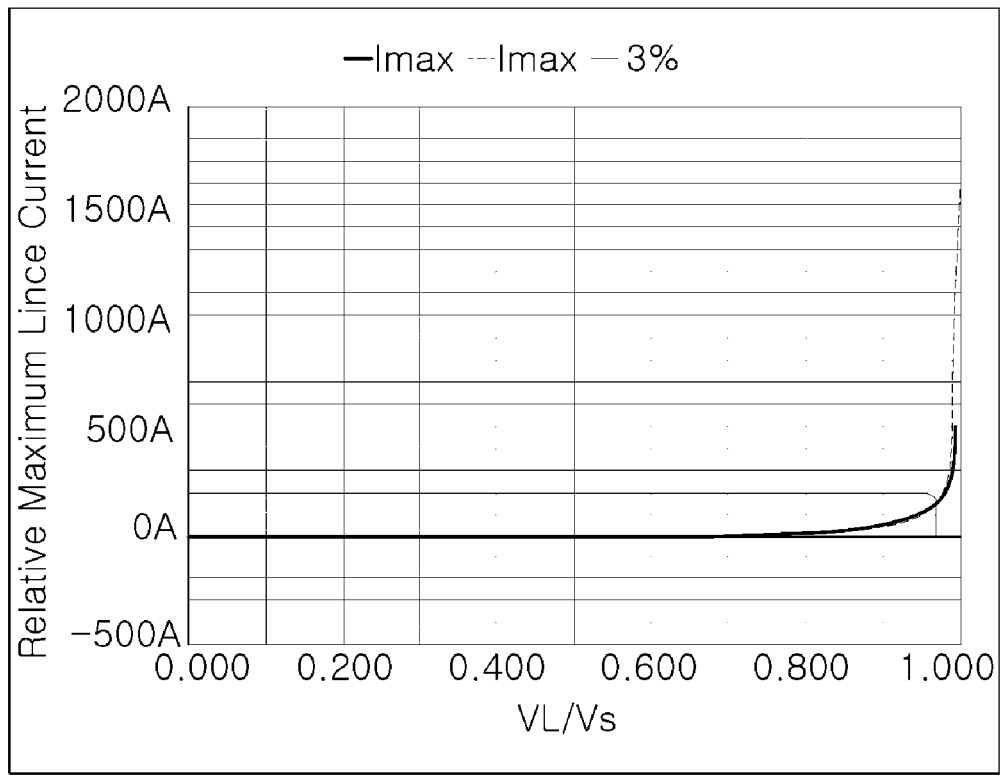
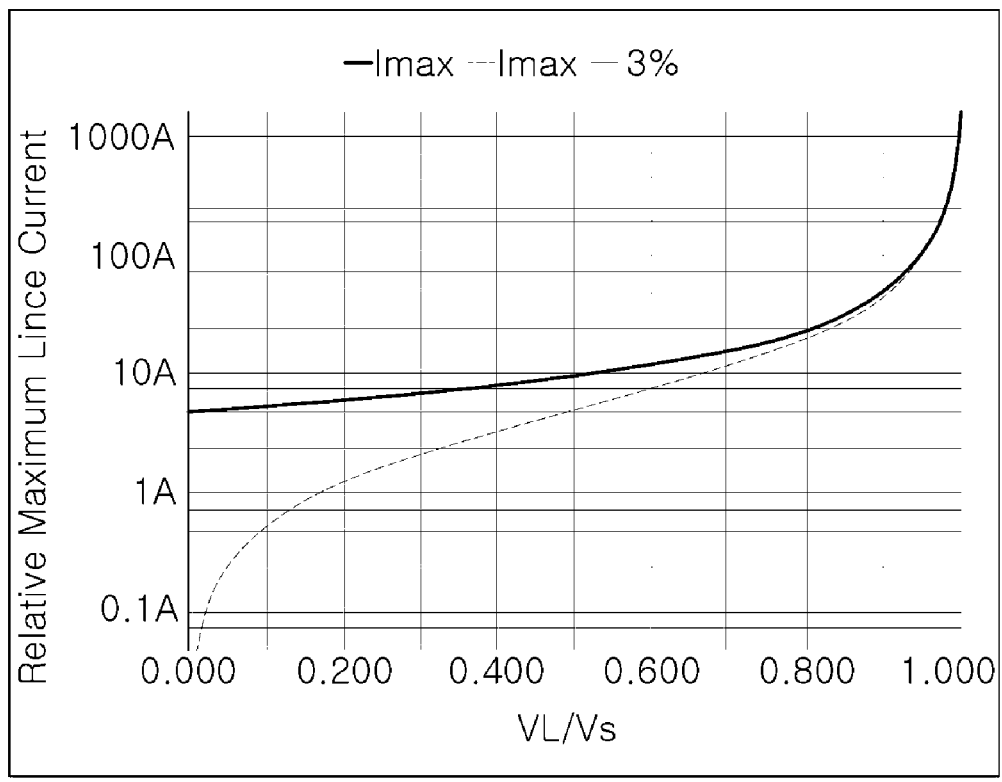

ELECTRIC DISASTER PREEMPTIVE DETECTION AND PREVENTION SYSTEM USING IoT TECHNOLOGY

CROSS-REFERENCE TO RELATED APPLICATIONS

The present application is a continuation of International Patent Application No. PCT/KR2020/009645, filed on Jul. 22, 2020. The disclosures of the above-listed applications are hereby incorporated by reference herein in their entirety.

BACKGROUND

Embodiments of the inventive concept described herein relate to a system for preventing electric disasters by measuring and analyzing properties of a line such as loss power and line resistance of the line and detecting abnormal symptoms of a power grid in advance. An electric circuit breaker cuts off load supply power when a current exceeds a predetermined threshold. Electric fire may occur under the condition that the electric circuit breaker has a safety reference below a safety limit. However, a conventional technology has no solution to the electric fire.

To detect abnormal symptoms of fire that occurs in an electrical distribution network, the inventive concept continuously measures the physical quantity of a line at a feed end and a load end in an active state by using a communication technology such as an IoT technology, indirectly measures a power lost on the line and line resistance causing the power lost, detects a fault in a line, and detects fire symptoms.

A conventional fire detection technology mostly uses a method of monitoring a physical signal generated in a case of fire, or cutting off a circuit when an allowable current is exceeded. However, it is impossible to prevent fire caused by deterioration of a transmission line within an allowable trip current of an overcurrent circuit breaker. It is difficult to detect causes of fire due to power loss in a line through the conventional current blocking technology. The conventional overcurrent circuit breaker has insufficient countermeasures against fire due to sparks such as heat generation on a line or contact instability, arc, and the like within a cutoff setting current.

SUMMARY

Detecting faults in a power grid that supplies power is very important and affects safety management and preventive maintenance/repair. In detail, it is very important to detect faults before disasters occur. A lot of studies have been conducted for early detection of faults in a power system since electricity began to be used.

However, although most power systems have safety devices such as overcurrent circuit breakers, inadequate power supply to loads of power facilities and faults on lines may be present, which may be a serious hazard. Even though a dangerous situation occurs, there is a region where a conventional safety device is not capable of detecting risk factors. There may be faults in a power supply due to deterioration of a line, such as abnormalities in a line, which is a power supply means, or a connection of a circuit breaker, chemical modification, and half-break in a conventional electrical safety technology. However, countermeasures against the above defects are insufficient. In other words, it relies on the same conventional safety device regardless of a size of a load or a condition of a line.

Because conventional overload/leakage current blocking technologies detect an overload, a short circuit, and a leakage current, accident prevention countermeasures (functions) against the overload and leakage current may be solved among main causes of electrical disasters. However, it is impossible to detect arcs/sparks generated from poor contact such as a line or switch within a regulated power.

As shown in a table, only when a device failed or only after an electrical fault affects the device due to the electrical fault in a power grid or power system, the main safety technology may detect faults. The conventional overcurrent circuit breaker technology still has a region where an accident caused by a fault in a transmission line is not detected.

A threshold of the conventional electrical safety protection technology is set by multiplying a maximum value of available current capacity of a load by a margin. This depends on one line protection mechanism when a power system with multiple loads uses one line. In other words, a protection threshold is determined by the sum of current capacities of loads connected to a line. Accordingly, when a device having a heavy load capacity and a load having a light load are mixed, a trip condition is set suitable for the heavy load, and thus the light load (a short circuit within the rating of a protector) are relatively out of a protection region. The protection mechanism does not operate properly depending on a load or the allowable capacity of a line and is collectively applied to the one line. Accordingly, there is a region where the protection function is not detected.

Furthermore, conventional safety cutoff technologies may not distinguish a light short circuit from a normal load, and thus the conventional safety cutoff technology may inaccurately detect a light short circuit or an electric shock. Accordingly, there is a region where the risk of fire or electric shock is not detected.

The conventional circuit breaker determines whether a current thus passing does not exceed a predetermined level. An arc-fault circuit interrupter (AFCI) checks the current to search for a current changes indicating Arc fault. It is a method of determining whether the current does not exceed the predetermined level.

"Parasitic" resistance occurs due to poor connection, poor contact, and aging/deterioration of a line. This parasitic resistance satisfies a specific condition ($R_{para} \geq V_S/I_{Trip}\eta$, $\eta$: trip magnification maintained for 1 sec), the parasitic resistor acts as a current limiter and prevents a current of a faulty circuit from being out of a predetermined trip level range of a fuse or circuit breaker that is used in the corresponding circuit. When the total parasitic resistance satisfies the condition ($R_{Para} \geq V_S/I_{Trip}\eta$, $\eta$: trip magnification maintained for 1 sec), a short circuit is very dangerous. At this time, the worst case ($P_{Loss} - V_S \cdot I_{Trip} \cdot \eta$) occurs (see FIG. 5).

In general, electrical accidents occur due to poor connection, a short circuit, a light short circuit, load connection/disconnection, short-term line disconnection, or other electrical faults. Accordingly, the detection of electrical faults is very important. When the above electrical faults are found before or at the beginning of the accident, damage may be minimized. The inventive concept may measure power loss or line resistance on a line receiving power and may estimate the amount of heat generated on the line.

To solve these problems, the technical idea according to an embodiment of the inventive concept may implement a verification/detection mechanism that is capable of collecting data at any time (in real time) by using (live-wire) measurement technology and Internet of Things (IoT) technology on a power grid in a form of a distributed mesh network, detecting/monitoring abnormal symptoms of an accident in advance (beforehand) by using a method of obtaining energy loss due to faults in a power grid through the extended interpretation of Kirchhoff's current and voltage laws, and maintaining the integrity of the power grid or operating the power system only within a safe range, thereby implementing an electric disaster prevention system capable of fundamentally preventing electric disasters.

In an embodiment of the inventive concept, the causes of electrical disasters are roughly classified into two types of electrical faults as follows. An electrical fault such as a leakage current, faulty/damaged insulation, insulation breakdown (moisture/dust), ground fault/contact, a short circuit, tracking, an overload/overcurrent, or the like is collectively defined as a parallel fault. An electrical fault such as conductor breakage (half breakage), a connection fault (a connection defect), a contact defect, a crimp damage, or the like is collectively defined as a serial fault.

In an embodiment of the inventive concept, the electrical fault may be detected in advance by using an active wire measurement technology, and thus the power consumed by all abnormal loads may be detected in real time.

The inventive concept relates to a method of continuously monitoring electrical faults of a power grid and automatically taking appropriate measures. Before chronic static/progressive faults lead to accidents, abnormal symptoms may be detected and thus accidents may be predicted. Accordingly, the inventive concept may preemptively prevent disasters. Moreover, random/sudden accidents such as a light short circuit (a short circuit having a trip current or less, an electric shock, or the like) of an active wire charging circuit capable of being detected by a conventional protector (such as a circuit breaker) may be detected at an early stage, thereby preventing accidents from progressing by using the method to cut off the power supply to a power grid.

To detect fire abnormal symptoms, the inventive concept detects abnormal symptoms by using a method of measuring basic electrical properties such as voltage and current of a feed end and a load end in a state where an electrical network is energized, measuring electrical properties such as line resistance, parasitic resistance of a connection, power lost in a line, a leakage current, an allowable maximum current of a line, overload, occurrence of arc phenomenon, current instability, or the like, analyzing the electrical properties in real time, and tracking changes in the electrical properties in real time.

1. Detection of Disaster Abnormal Symptoms

According to an embodiment of the inventive concept, a symptom detection technology of electrical disasters may continuously measure basic physical quantities such as a line voltage and a line current at a feed end and a load end in an active state (live), may convert line resistance and line loss power in real time, and may estimate the amount of heat capable of being generated on a line. Accordingly, fire may be prevented by notifying a manager or removing the cause of disasters before the disasters are developed.

Furthermore, it is possible to calculate an actual allowable current again according to a decrease in an allowable current, the deformation of a line, and the deterioration of the line. The progress of deterioration of a line may be detected by collecting and analyzing the actual allowable current, and thus repair information such as replacement of an aging line may be provided. Various communication technologies may be used to measure the physical quantity of a remote distributed network where a feed end and a load end are physically separated. In particular, the physical quantity may be easily measured by using wireless IoT technology.

2. Detection of Faults in a Line

A power grid that supplies power may have various electrical faults for various reasons. For example, there are electrical contacts, carbonization of connections, incomplete connections, loose connection states, contact resistance, poor contact, connection faults, insulation breakdown, improper installation, damage, semi-disconnection, physical aging/transformation, and chemical corrosion. According to an embodiment of the inventive concept, an electrical component related to heat generation due to this degradation phenomenon is expressed as parasitic resistance 4.

FIG. 2 is a basic electric circuit in which a power source, a transmission line, and a load are connected in series. The causes of line electrical fires are line deterioration and overcurrent. The main cause of fires occurring in lines may be found in changes in electrical properties, such as an increase in parasitic resistance ($R_{Para}$, $R_{FS}$) due to the line deterioration. When a current flows, power loss occurs and is immediately converted into Joule heat due to the increase in line resistance. When the converted heat exceeds a specific level, fire may occur. To this end, it is necessary to minimize heat generation or to detect whether such the phenomenon is present, in advance.

A resistive element among parasitic elements is changed to Joule heat when a current flows, and thus a line fault caused by the increase of the resistive element is detected. The deterioration resistance of a line is more dangerous than the distributed resistance of a line in a form of the same distribution constant because the deterioration resistance of a line concentrates on a specific physical location.

The loss of electrical energy due to the parasitic resistance of a line appears as an increase in power dissipated between opposite ends of the line or an increase in voltage drop, and thus the breakdown of dielectric strength causes a leakage current or a short circuit. In general, energy loss occurs due to the leakage current or semi-short circuit of a power grid in an active state. This energy loss exceeds a limit and then a hazardous situation occurs. At this time, it shows abnormal symptoms such as temperature rise and power consumption increase. Accordingly, when this electrical abnormal symptom is detected at an early stage, it is possible to prevent electrical fire occurring on a line. Moreover, the abnormal symptom may be measured and quantified, and thus it may be used as a factor capable of objectifying the safety of a line.

As that solution, when the power loss between a feed end and a receiver end is measured and analyzed in real time (when being processed through the following process), abnormal symptoms of risk may be detected.

In a series network of FIG. 2, when a voltage ($V_S$) at the feed end, the voltage ($V_L$) at the receiver end, and a load current ($I_L$) are measured and converted, line loss power ($P_{Ln}$) (line dissipation power), line resistance ($R_{Ln}$), load power ($P_L$), load resistance ($R_{Ln}$), and total supply power ($P_S$) may be obtained. FIG. 3 shows the line loss power, load power consumption, and total power consumption trend according to a change in the line resistance ($R_{Ln}$), when there is no leakage resistance ($R_{FP}$) in an equivalent circuit of a power grid modeled in FIG. 2.

When the power dissipated in a line exceeds a specific amount, fire may occur. Accordingly, when the power exceeds a set reference value, it is possible to prevent fire by blocking the supply power to a load. This dissipated power may cause fire even within an allowable current of an overload circuit breaker 14. In this case, maximum line loss power ($P_{Ln}$) may reach 25% of the load low reverse power ($P_{L0}$)($R_{Ln}/R_L=1$). Accordingly, as the rated power of a load is high even with the same line condition, fire may occur.

3. Measurement of Line Loss Power and Detection of Deterioration Abnormal Symptom The loss power of a line is the direct cause of line fire. The line loss power is due to excess of allowable power or deterioration of a line (a line fault) aging physical/chemical deformation. A deteriorated portion generates relatively excessive joule heat. This heat may be a direct cause of fire.

In a simple series circuit shown in FIG. 2, because a current at the feed end is the same as a current at the receiver end, the line loss power ($P_{Ln}$) may be obtained by measuring the voltage ($V_S$) of the feed end, the voltage ($V_L$) of the receiver end, and the load current ($I_L$) by using Equation 1.

$$P_{Ln}(V_L - V_S)I_L \qquad \text{[Equation 1]}$$

Here, $P_{L0}$ denotes load rated power; $R_{Ln0}$ denotes normal resistance of a line; and $R_P$ denotes abnormal loss power generated from parasitic resistance ($R_{PARA}$, $R_{FS}$) of the line.

Abnormal power loss ($P_P$) is obtain by subtracting ($P_P = P_{Ln} - P_{Ln0}$) normal line loss power ($P_{Ln0}$) from the line loss power ($P_{Ln}$). Due to the parasitic resistance caused by a fault, the normal line loss power ($P_{Ln0}$) is close to 0, that is, "$P_P \cong P_{Ln}$".

In a case of, the trend of the load power ($P_L$) and the line loss power ($P_{Ln}$) according to an increase in the parasitic resistance ($R_P$) of a line in a load with rated power is shown as the relative power loss ($P_{Ln}/P_{L0}$) shown in FIGS. 3 and 4. In a case of the line loss power ($P_{Ln}$), when line resistance ($R_{Ln} - R_{Ln0} | R_P$) is the same as load resistance ($R_L$), the maximum power loss occurs in the line.

In general, a condition of "$R_P \gg R_{Ln0}$" is satisfied during line deterioration, and thus loss power becomes "$P_P \gg P_{Ln0}$". Accordingly, the parasitic resistance ($R_P$) is concentrated in a local portion, and thus the heat generated by the relative power loss ($P_{Ln}/P_{L0}$) is concentrated on a portion of the parasitic resistance ($R_P$). The line loss power ($P_{Ln}$) is converted to Joule heat. When the Joule heat exceeds a specific value, fire may occur. There is a need to set a limit. When the Joule heat exceeds the limit, it is necessary to cut off a load or to take follow-up measures.

Here, even in the case of the same loss power, it is relatively more dangerous because the heat of the deteriorated portion of the line is concentrated.

FIGS. 4 and 6 show a relationship between a voltage drop, a load voltage, and the line loss power ($P_{Ln}/P_{L0}$) between opposite ends of a line according to a change in line resistance ($R_{Ln} - R_{Ln} + R_P$). The symptoms of line deterioration are shown in the drawing and Equation 5. Because a change in line resistance appears as an increase or decrease in line loss power and an increase in line voltage drop, it is possible to detect dangerous abnormal symptoms by monitoring the change. Accordingly, these values ($P_P/P_{L0}$, $V_P/V_S$) may also be used as a line fault index indicating the risk of distribution lines. As shown in the drawing, because abnormal symptoms may be observed as quantified values, the load power needs to be cut off when a specific value (a threshold) is exceeded.

$$\frac{P_{Ln}}{P_{Lmax}} - \frac{R_{Ln}}{(1 + R_{Ln}/R_L)^2}$$

4. Measurement of Line and Parasitic Resistance

It is important to understand properties of a transmission line established in a power grid. Line resistance is basic data capable of analyzing not only accident prevention but also deterioration factor analysis or deterioration trend/progression. A method for calculating the line resistance in an energized state is provided. The following method may be calculated online, such that the measured value is capable of being collected on a network.

When the voltage ($V_S$) of the feed end, the voltage ($V_L$) of the receiver end, and the load current ($I_L$) are measured and converted, the line resistance ($R_{Ln}$) and the load resistance ($R_L$) may be obtained. FIGS. 6 to 8 and Equation 2 show the correlation between a relative voltage ratio ($V_L/V_S$) of the feed end and the receiver end, and the line resistance ($R_{Ln}$).

$$R_{Ln} = R_{Ln0} + R_p = \frac{(V_S - V_L)}{I_L} \qquad \text{[Equation 2]}$$

$$R_p = \frac{(V_S - V_L)}{I_L} - R_{Ln0}$$

$$R_{Ln} = \frac{\left(1 - \frac{V_L}{V_S}\right)}{\left(\frac{V_L}{V_S}\right)} \cdot R_L$$

$$\frac{R_{Ln}}{R_L} = \frac{\left(1 - \frac{V_L}{V_S}\right)}{\left(\frac{V_L}{V_S}\right)}$$

5. Detecting of Fire Symptoms and Taking (Preventing) of Preemptive Measures

Electrical fire shows various abnormal symptoms such as temperature rise, odor, flame, arc/spark, spark, an increase in electrical resistance of a power line or an increase in line power consumption, a leakage current, and the like before the fire occurs. Among the various abnormal symptoms, the typical electrical abnormal symptoms capable of being detected due to a fault in a line are as follows.

1. An increase in line resistance or unstable line resistance.
2. An increase (change) in line loss power.
3. An increase in a line drop voltage.
4. A drop in a load voltage.
5. An increase in a voltage fluctuation rate.
6. An increase in a line leakage current.
7. Reduction of line dielectric strength.
8. Reduction of a load current or unstable load current.
9. An increase in temperature of a line.
10. Expression of arc/tracking phenomenon.

FIGS. 1, 12, 13, 14, 15, and 19 show examples of implementation of a technology for detecting occurrence of fire in advance by monitoring a voltage drop or loss power between opposite ends (feed end-receiver end) of a line, which is to be easily measured, among the electrical abnormal symptoms of the power grid. An increase in parasitic resistance of a power line appears as a change in electrical energy loss (power consumption) on a line. As the resistance of an electrical defect portion increases, the voltage drop and power dissipation of the line increase.

When the voltage drop exceeds a specific limit, it may cause fire. Accordingly, the power dissipation in the line may be obtained by multiplying the voltage drop by a current. An accident may be prevented by supplying power only within a safe range that does not exceed a specific value (threshold) of the dissipated power. The electrical fire abnormal symptom may be measured and quantified, and thus the electrical fire abnormal symptom thus measured and quantified may be used as a fire prediction technology. Accordingly, when a means for detecting and processing the electrical abnormal symptom is provided, it is possible to implement a system for preventing electrical fire occurring on a line.

FIG. 10 shows a change in line loss power according to a change in line resistance at a specific load. When line resistance increases, line loss power also shows an increasing trend. When the line resistance has the same value as load resistance, the line loss power has a maximum value. At this time, the maximum loss power reaches ¼ of the rated load power, and thus this is the most dangerous situation.

FIGS. 10 and 11 show that parasitic resistance may prevent an overload circuit breaker from escaping a predetermined threshold because the parasitic resistance caused by line deterioration functions as a current limiter to reduce a load current.

The inventive concept may detect symptoms of a fire accident that may occur on a line by measuring the power lost in the line. It is possible to prevent fire occurring on the line through a method for cutting off a load current when a threshold is exceeded after the line voltage drop and load current are measured and the loss power is calculated. Moreover, when the line resistance value increases by a specific value or more after being converted, the same result may be obtained even when the load current is cut off. When the voltage of the feed end is stable, the desired purpose may be achieved simply by measuring only the voltage drop rate.

In the case of departure from safe operation regions (110, 120) that is, a green region, it is desirable to cut off a load.

Conventional fire prevention methods are mainly to detect and cut off overcurrent, leakage current, and arc generation. However, it is difficult to detect fire caused by an increase in line resistance through the method. That is, fire may occur due to deterioration of the line even in a normal load within the allowable current. A dotted line 160 corresponds to a region in which excessive power capable of causing fire is lost. When this region is entered, the supply power needs to be cut off immediately.

The threshold may be set in various manners.

6. Measurement of Allowable Maximum Current of Line

The deterioration a line is the main cause of fire. When the resistance or an allowable maximum current of an installed line is calculated in advance to prevent the fire, the available power may be calculated. Accordingly, the calculation may be used to establish a safe power grid.

A safe maximum current value (an allowable maximum current value) ($I_{Lmax}$) of a line may be converted by measuring the power supply voltage ($V_S$) of a feed end, the voltage ($V_L$) of a receiver end (load), and the load current ($I_L$) and applying an allowable maximum voltage drop rate ($\varepsilon_0$)

$$I_{Lmax} \leq \frac{\Delta V}{R_{Ln}} = \frac{\varepsilon_0 V_S}{R_{Ln}} - \frac{\varepsilon_0 V_S V_L}{(V_S - V_L)R_L} \quad [\text{Equation 4}]$$

$$= \frac{\varepsilon_0 V_L}{\left(1 - \frac{V_L}{V_S}\right)R_L}$$

$$= \frac{\varepsilon_0 V_L}{\left(1 - \frac{V_L}{V_S}\right)R_L}$$

-continued $$I_{Lmax} \leq \frac{\varepsilon_0 V_L I_L}{(V_S - V_L)} = \frac{\varepsilon_0 I_L}{(1 - V_L/V_S)} [A]$$

The safety maximum current value (the allowable maximum current value) ($I_{Lmax}$) has the following correlation with the power supply voltage of the feed end, the voltage of the receiver end (load), and the load resistance. The correlation may be obtained by Equation 5.

$I_{Lmax}$: allowable maximum current value [Equation 5]

$R_{Ln} = (V_S - V_L)/I_L$ $I_{max} = V_S(1-\varepsilon)/R_{Ln}$ $$\therefore I_{max} = \frac{V_S(1-\varepsilon)}{(V_S - V_L)/I_L} = \frac{V_S(1-\varepsilon)}{(V_S - V_L)} \cdot I_L$$

7. Detection of Power Grid Faults

The key principle of an electric disaster prevention technology refers to measuring/analyzing the physical quantity of a line, to which electrical properties of the line due to a current flowing in the line is reflected, detecting a line defect, and finding symptoms of fire based on the detected line defect.

As shown in FIG. 2, to detect a fault in a line that transmits power in an electrical network, a voltage drop, a load voltage, and the line loss power ($R_{Ln}/P_{L0}$) between opposite ends of a line are changed depending on a change in line resistance ($R_{Ln}$–$R_{Ln0}$+$R_P$). The symptoms of line deterioration are shown in FIG. 3. Because a change in line resistance causes abnormal symptoms of an increase and decrease of line loss power and an increase of line voltage drop, a dangerous situation is predicted and detected by monitoring the abnormal symptoms. In the implementation of a controller, no matter which physical quantity such as line loss power, line voltage drop, a load voltage fluctuation, or line resistance is selected as a control variable, the desired purpose may be achieved by detecting the abnormal symptoms.

As shown in FIG. 10, because abnormal symptoms of a power grid may be observed as quantified values, the load power needs to be cut off when a threshold is exceeded. Here, a threshold 79 may have a fixed value or may be dynamically set depending on a power supply time, an input power voltage, a load type and properties of a load as necessary, thereby building a flexible and sophisticated system. To this end, it is possible to build a more suitable system for situations by dynamically setting the threshold 79 after properties of the load are learned. Besides, in addition to the simple on/off method, a soft start method may also be considered for shutting off or inputting the load power, and may be applied to all electrical devices regardless of AC/DC.

The embodiment shown in the conceptual diagrams of FIGS. 1, 12 and 13 may include a means 10 for measuring a line voltage of a feed end 11, a means 20 or 22 for measuring the line voltage and a current of a receiver end, a calculation means 44 or 46 and a control means 50, 82, or 98 for measuring (21, 23) physical quantities to which electrical properties of a line are reflected, comparing physical the quantities, and generating a load control signal depending on the result, and a load control means 24 capable of controlling power supplied to a load 2 depending on the control signal. According to an embodiment of inventive concept, the following operations will be performed.

1. Supplying power to a load.
2. Measuring the feed end voltage 11, a receiver end voltage 21, and a load current 23.
3. Obtaining a line voltage drop 45 by subtracting the receiver end voltage 21 from the feed end voltage 11.
4. Obtaining line loss power 47 by multiplying the drop voltage by the load current 23.
5. Comparing the line loss power 47 with a threshold 58.
6. Cutting off power supplied to a load and activating a protector when the comparison result exceeds a threshold.

A current flowing in a line and the line loss power, to which electrical properties of the line are reflected, are measured. When a specific value is exceeded, it is determined that a fault is present, and appropriate follow-up measures are taken. As a result, the threshold becomes the maximum value of allowable line loss power.

Malfunctions due to noise and transients may be minimized by performing an input based on a cumulative value from integrating the measured value in measuring the physical quantity such as line loss power and applying filtering technologies such as moving average filtering. Accordingly, reliability may be improved.

An embodiment has been shown as a method for detecting line loss power abnormal symptoms. However, the implementation may be made more simply by applying a method of performing comparison based on a line voltage drop between a feed end and a receiver end. In this case, although a small line power loss occurs even at an extreme light load, there is a region that operates sensitively.

8. Compound Accident Loss Power

FIGS. 10 and 11 show loss power lost in a transmission line depending on a load change within an allowable trip current of an overcurrent circuit breaker. FIGS. 10 and 11 show line loss power capable of causing fire in a line in which an overcurrent circuit breaker is not capable of detecting a fault. That is, even though a dangerous situation has occurred, the overcurrent circuit breaker does not detect a fault. The maximum loss power lost within an allowable trip current of the overcurrent circuit breaker is as follows.

$$P_{Lnmax} = \frac{V_S}{2}I_{Trip}[W],$$

$$P_{Lnmax} = \frac{V_S^2}{4R_{Ln}} = \frac{V_S}{3}I_{Trip}[W]$$

$$R_{LnTrip} = \frac{V_S}{2I_{Trip}}[\Omega]$$

$I_{Trip}$ a trip current of rated current capacity of a current circuit breaker Because power loss of "$V_S I_{Trip}/2[W]$" occurs on a line when line resistance is the same as a value of "$V_S/2I_{Trip}$", this is the most dangerous time (when a trip current is 200% of a rated current).

In a conventional overcurrent circuit breaker technology for preventing electrical accidents, accidents due to an overcurrent may be prevented by using a method of controlling power supplied to a load in a manner of determining whether the load current exceeds the limit, based on whether the load current exceeds an allowable limit. However, it is not possible to prevent (detect) an accident caused by a short circuit having properties of a leakage current (hereinafter referred to as a light short circuit) or a line defect within the rating of a protector.

Conventional protection technologies do not operate based on a mechanism that determines whether a line is operating properly depending on the actual power supply capability of the line. As shown in FIGS. 10 and 11, an increase in parasitic resistance or a light short circuit due to deterioration of a line may cause accidents.

Line power loss is immediately converted to Joule heat. When a specific value is exceeded, a condition for fire is satisfied, and thus necessary measures need to be taken. (This needs to be minimized.) Here, the deterioration of a line includes all electrical properties on not only the line but also a transmission path. For example, there are electrical contacts, carbonization of connections, incomplete connections, loose connection states, contact resistance, physical deformation, semi-disconnection, and chemical corrosion. According to an embodiment of the inventive concept, the electrical property is expressed as the parasitic resistance 4.

The causes of line electrical fires are line deterioration and overcurrent. The main cause (electrical contacts, carbonization of connections, incomplete connections, loose connection states, contact resistance, physical deformation, semi-disconnection, and chemical corrosion) of fire occurring in a line may be found in a change of electrical properties such as an increase in parasitic resistance due to deterioration of a line. When a current flows, power loss occurs and is immediately converted into Joule heat due to the increase in line resistance. When the converted heat exceeds a specific level, fire may occur. To this end, it is necessary to minimize heat generation or to detect whether such the phenomenon is present, in advance.

The parasitic resistance components that cause electrical fire are not directly measured under energized conditions. To obtain an exact value, the parasitic resistance components may be derived or detected by analyzing the loss power of electrical components, changes in line voltage drop, arc energy spectrum, and the like, which are indirect methods.

A resistive element among parasitic elements is changed to Joule heat when a current flows, and thus a line fault caused by the increase of the resistive element is detected. The deterioration resistance of a line is more dangerous than the distributed resistance of a line in a form of the same distribution constant because the deterioration resistance of a line concentrates on a specific physical location.

Loss of electrical energy on a line appears as an increase in power or voltage between opposite ends of a line. When the energy loss exceeds a limit, a hazardous situation occurs. At this time, it shows abnormal symptoms such as temperature rise and power consumption increase. The abnormal symptom may be measured and may be objectively quantified, and thus the abnormal symptom thus objectively quantified may be used for a fire prevention technology when measured actually. Accordingly, when this electrical abnormal symptom is detected at an early stage, it is possible to prevent electrical fire occurring on a line. The detection means is included in a power facility such that detection is capable of being made at all times. However, the detection may be made in terms of safety inspection as necessary.

To solve the above problem, when the power loss between a feed end and a receiver end is measured and analyzed in real time (when being processed through the following process), abnormal symptoms of risk may be detected, thereby preventing accidents.

The inventive concept refers to a technology of measures a physical quantity, to which electrical properties of a line due to a current flowing in the line connecting opposite ends are reflected, in a series network composed of a feed end 1 (power) basically supplying power, a line transmitting the power, and the receiver end 2 (load) receiving the power, analyzing the measured physical quantity, and detecting a fault.

Line measurement devices include an ohmmeter, an impedance meter, a leakage-current meter, a phase difference meter, and the like. However, line measurement technologies are not suitable for an energized network. To prepare for unexpected accidents, it is necessary to implement an optimized electric disaster prevention system capable of continuously detecting a fault.

9. Line Impedance Measuring Device

FIG. 8 illustrates that an unknown line impedance of an existing transmission line is measured in a power grid in an energized state. As shown in Equation 3, internal impedance may be measured through a known reference resistance without a current measuring means. FIG. 8 shows a network-based impedance measuring device capable of collecting data by measuring line impedance and transmitting the measured value over a network. The properties of a reference resistor are accurately known. In this method, the measurement error is low, and thus precise measurement is possible.

The internal impedance may be obtained with one voltage measuring means when the absolute value and phase of voltage are measured by using a method of measuring a no-load voltage ($V_{T1}$) and the measured load voltage, connecting known reference resistance ($R_{REF}$) to a terminal to be measured, measuring a load voltage ($V_{T2}$), measuring a change of the reference load and voltage, and finding out internal composite impedance ($Z_x$).

It is possible to measure the unknown internal impedance in a system having an internal power supply. To this end, it is possible to analyze the internal properties by using a voltage meter and a known resistance. First of all, the internal impedance may be obtained by Equation 3 by removing a load from an end to be measured, measuring and storing the no-load voltage ($V_{T1}$), connecting the next load, connecting the known reference resistance ($R_{REF}$) to the end to be measured, and measuring the load voltage ($V_{T2}$). The relative ratio of a load voltage and a load voltage and the internal impedance are shown in FIG. 7. The resolution of the measurement may be improved by appropriately selecting the reference resistance.

$$Z_x = \frac{\left(1 - \frac{V_{T2}}{V_{T1}}\right)}{\left(\frac{V_{T2}}{V_{T1}}\right)} \cdot R_{REF} \quad \text{[Equation 3]}$$

10. Power Grid Fault Detection Mechanism

FIG. 1 is a conceptual diagram of an electrical safety system for detecting abnormal symptoms of a disaster and preventing a disaster in a circuit network connected to a power supply, a transmission line, and a load.

A voltage measuring means for measuring voltages of a feed end and a receiver end and a current measuring means for measuring currents of the feed end and the receiver end are needed to implement a power grid fault detection function.

A communication means, a data analysis means, a calculation means, a processing means, and an output control means are required to exchange messages with the feed end and receiver end. In general, because the feed end and receiver end are physically separated from each other, a suitable means of exchanging messages is required. The transmission means may be implemented by using one of wired communication, optical communication, or a wireless technology. The means may be implemented with an IoT technology.

The electrical properties of a fault may all be measured by an electrical method. The inventive concept relates to a method of continuously monitoring electrical faults of a power grid and automatically taking appropriate measures. Before chronic static faults or progressive faults lead to accidents, abnormal symptoms may be detected and thus accidents may be predicted. Accordingly, the inventive concept may preemptively prevent disasters. Moreover, random/sudden accidents such as a light short circuit (a short circuit having a trip current or less, electric shocks, or the like) capable of being detected by a conventional protector (such as a circuit breaker) may be detected at an early stage, thereby taking effective measures by preventing the worst accidents.

10.1 Measurement of Dissipated Power on Power Grid

FIG. 12 is a system for preventing a disaster by cutting off power supplied to a line when power dissipated in a transmission line is excessive. In a power grid 300 connected between one feed end (upper node) 200 and one receiver end (lower node) 400, an input of an upper node is connected to the power supply 1. An output 290 is connected to an input terminal 390 of the lower node 400 via the power grid 300. A power system includes a communication means 500 for transmitting a message between the upper node 200 and the lower node 400. The power system may perform the following operation.

① Measuring and accumulating an input voltage 301 and an input current 203 and obtaining supply power 215.

② Measuring, by the lower node 400, load power (power of a receiver end) 415.

③ Receiving, by the upper node 200, load power 403T of the lower node 400, subtracting the load power 403T from the power supply 215, and obtaining dissipated power 205 (see FIG. 13).

④ Predicting the degree of deterioration of a transmission line through dissipated power 205 because the dissipated power 205 is an abnormal power due to series-parallel faults (320, 330, 3) of the transmission line.

⑤ Cutting off a supply power by generating a trip signal 209 when the dissipated power exceeds a predetermined threshold (an allowable value) 214 after being input to a comparator 206. Accordingly, accidents may be prevented in advance.

Here, when a load corresponds to multiple loads having two or more loads, the load may be additionally connected to the power terminal 290. Assuming that all the load power is subtracted in step 3, it may be applied to a power grid having multiple loads.

FIG. 13 shows a power grid configuration having one power supply (a feed end) and n (n: natural number) loads (receiver ends) as an embodiment for measuring dissipated power of the power grid 300 with multiple loads. A power wattmeter composed of the power supply 1 ($V_S$), a voltage meter 301, and a current meter, and all the load ends 2 (Load-1 to Load-n) are composed of power measuring means 414-1 to 414-$n$, an arithmetic means, a communication means, and a control means.

In a normal power grid, the power supplied from a power source needs to be entirely delivered to a load end. In a normal case, the power supplied from a power terminal needs to be the same as the sum of all load powers. However, when the two powers do not match with each other, it means that a leakage current is present. The inventive concept may calculate dissipated power through an indirect method even in an active state. When a difference between the supply power measured at a power terminal and all load power measured at a load is obtained, the dissipated power due to a leakage current may be obtained. Accordingly, the power needs to be measured at all loads.

When powers ($P_{L1}, P_{L2}, P_{L3}, \ldots, P_{L(n)}$) measured from all the loads are summed and then the summed power ($\Sigma_{i=0}^{n} P_{L(i)}$) is subtracted from the supply power ($P_S$), dissipated power ($P_F$) may be measured.

The dissipated power caused by serial-parallel faults is measured by obtaining a difference between the supplied power and the actual power delivered to a load for parallel faults such as a leakage current, short circuit, and a ground fault. A dissipated power 215P may be a difference between the total supply power of the power terminal and the sum of powers measured at each load, and it may be expressed by the following equation. The dissipated power includes all power losses caused by series-parallel faults.

$$P_F = \sum_{j=0}^{m} P_{FS}(j) + \sum_{k=0}^{l} P_{FP}(k) = P_S - \sum_{i=0}^{n} P_L(i) [W]$$

In FIG. 13, a quantitative value 215 of the abnormal dissipated power $P_F$ lost in a power grid may be obtained. When this dissipated power increases and exceeds a limit (when there is no countermeasure against the power dissipation), it may cause an accident. When the dissipated power exceeds the limit, supply power at a power supply terminal may be blocked, thereby preventing accidents or taking measures when an accident occurs. Furthermore, when an increase in the dissipated power 215P is tracked, it is possible to detect symptoms of an accident.

Moreover, the quantitative value of the dissipated power has a function relationship with a limit 214 of a dangerous level, and thus a dangerous index 217 may be obtained by using the quantitative value. Because the dangerous index is quantified, preemptive measures may be taken before an accident occurs.

In this embodiment, the quantitative value 215P of the dissipated power in a power grid may be extracted in real time, and thus the integrity of a line may be quantified. Besides, when the maximum limit is determined, the level of risk may be quantified, and thus maintenance/repair information of the power grid may be derived.

Measurement of Dissipated Power of Power Grid

The inventive concept may measure the dissipated power caused by all abnormal loads in the following method.

① A feed end supplies power to a load end through a power grid.
② All load ends measure load power and transmit the load power to the feed end (feedback).
③ The feed end sums up load powers of all the loads.
④ The feed end obtains the dissipated power (line loss power) by obtaining a difference between power supplied to a load end and the sum of load powers.

The dissipated power is caused by specific resistance of a line or parasitic resistance as well as the degradation of dielectric strength. Because the dissipated power corresponds to all abnormal power other than a normal load, the measurement result may be used as basic data for preventing accidents or determining abnormal symptoms of a power grid. An increase in the dissipated power leads to an accident. In the inventive concept, a quantitative value of the dissipated power may be known before an accident occurs, and thus it is possible to know the progress of a leakage current/short circuit accident. In other words, it is possible to quantitatively express abnormal symptoms of accidents caused by a leakage current. Also, a leakage current may be detected, but the method may not be designed to be more sensitive than a method for detecting a leakage current described below.

Besides, when data is systematically managed by using DB by continuously monitoring the dissipated power, it is possible to trace a history of the progress of a leakage current/short circuit.

10.2 Detection of Leakage Current or Short Circuit of Active Wire Charging Line-Detection of Leakage Current (Detection of Electric Shock)

FIG. 14 shows a configuration of the feed end 200 and the receiver end 400 added to detect faults and accidents on a line, which occur in a power system. The detection principle refers to a method for measuring dissipated power (the loss power consumed in a transmission line), a leakage current, and a line voltage drop and calculating abnormal power through network analysis.

The power system includes the message transmission means 500 between the upper node 200 and the lower node 400 by adding, to the line 300, the power supply 1 connected to the input terminal of the upper node 200 and the output 290 connected to the input terminal 390 of the lower node 400 via the power grid 300. The operation of the power system is as follows.

① The upper node (a feed end or a power terminal) 200 measures the input voltage (power voltage) 1 and transmits the input voltage to the lower node (a receiver end or a load end) 400.
② The lower node 400 transmits power information (current or power) 403 of a load to the upper node 200.
③ The upper node 200 receives a feeding current 403T of the lower node, subtracts the supply current 403T from a power supply current 203 of the upper node 200, and measures the leakage current 205.
④ Faults 330 and 3 of a transmission line are detected by determining whether the leakage current exceeds a predetermined threshold (an allowable value) 214.
⑤ A load breaker 210 cuts off all powers supplied to a load to prevent accidents when the leakage current exceeds a predetermined threshold (an allowable value) 414.
⑥ Besides, it is possible to quantify a dangerous index by calculating an extent to which the leakage current approaches a set threshold.
⑦ The threshold limit is usually set to the maximum value that allows accident-free operation.

Here, when a load corresponds to multiple loads having two or more loads, the load may be configured to go through the receiver end 400. Assuming that all the load currents are summed in step 3, it may be applied to a power grid having multiple loads. Furthermore, serial fault detection 310 of a line may be detected in the receiver end 400 in the following method.

⑧ The lower node receives a feeding voltage 203T of the upper node, subtracts a voltage (load voltage) 401 of the lower node from the feeding voltage 203T, and obtains a voltage drop (a voltage difference) 405, that is, a voltage drop to which properties of a line are reflected. Because a different path is formed when a parallel fault occurs, errors may occur. There are some problems, but the method is useful for detecting line faults.

⑨ A fault in a transmission line is detected by determining whether the voltage drop 405 exceeds the predetermined threshold 414 of the voltage drop. When a dangerous situation occurs, the load end 400 that exceeds line capacity partially removes only the corresponding load. Accordingly, this method is useful because it does not affect the entire system.

10.3 Detection of Leakage Current, Short Circuit, and Electric Shock Due to Reduction of Dielectric Strength of Multi-Load Power Distribution Network, and Prevention Against Disasters FIGS. 13 and 15 show a power grid configuration having one power source and n loads (n: natural number) as an embodiment for detecting a parallel fault of a power grid. The power supply 1 and all load ends (Load-1 to Load-n) include voltage measuring means (voltage meter) 412-1 to 412-n and current measuring means (current meter) 414-1 to 414-n.

Conventional safety technologies may easily detect unbalanced current leakage in a line. However, balanced current leakage (a line-to-line short circuit) is indistinguishable from a normal load, and thus it is difficult to detect the balanced current leakage.

Leakage current detection between active lines is possible by cutting off power of all loads and measuring a power current. However, when the power supply to a load is cut off, other problems may occur. Moreover, it may be difficult to detect a progressive fault (a leakage current). A technology for measuring/detecting a leakage current in an active state, in which a power is supplied, is very important. The leakage current detection technology in the active state is effective in preventing accidents because it is possible to monitor a leakage current at all times.

On the transmission line (5, 300), properties of a line are reflected to a load current for a serial fault FS201 such as inherent line resistance and poor connection. However, it is impossible to directly measure a leakage current caused by parallel faults (FP204, FP206, FP208) crossing a line in the active state to supply power to a load. The inventive concept may calculate the leakage current due to the parallel fault through an indirect method.

In a normal power grid, the power supplied from a power source needs to be entirely delivered to a load end. In a normal case, the current supplied from a power terminal needs to be the same as the sum of all load currents. However, when the two currents do not match with each other, it means that a leakage current is present. When a difference between the supply current measured at a power terminal and all load current measured at a load is obtained, the leakage current may be obtained. Accordingly, currents need to be measured at all normal loads.

When currents ($I_{L1}, I_{L2}, I_{L3}, \ldots I_{Ln}$) measured from all the loads are summed and then the summed power ($\Sigma_{i=0}^{n} I_{L(i)}$) is subtracted from the supply current ($I_S$), the leakage current ($I_{FP}$) may be measured.

The leakage current caused by a parallel fault may be measured by obtaining a difference between the supplied current and the actual current delivered to a load for parallel faults such as a leakage current, a short circuit, and a ground fault. The leakage current may be a difference between the total supply power and the sum of powers measured at each load, and it may be expressed by the following equation. The leakage current caused by the parallel fault is as follows.

$$I_{FP} = \sum_{k=0}^{l} I_{FP}(k) = I_S - \sum_{i=0}^{n} I_{L(i)} [A]$$

The inventive concept may measure the leakage current caused by all abnormal loads in the following method.

① A feed end supplies power to a load end through a power grid.

② All load ends measure a load current of a load end among all the load ends and transmit the load current to the feed end (feedback).

③ The feed end sums up load currents of all the loads.

④ The feed end obtains the leakage current by calculating a difference between the current supplied to the load end and the sum of the load currents.

In an embodiment, a quantitative value of the leakage current in a power grid may be extracted in real time, and thus the integrity of a line may be quantified. Besides, when the maximum limit is determined, the level of risk may be quantified, and thus maintenance/repair information of the power grid may be derived. This current means that there is a parallel path (parallel fault) across a power line, such as a short circuit. When the leakage current increases and exceeds a limit (when there is no countermeasure against the leakage current), it may cause an accident. Accidents may be prevented or fire may be extinguished early in an accident, by cutting off the supply power at a power supply end when the leakage current exceeds a limit. In addition, an increase in a leakage current may be tracked and thus abnormal symptoms may be detected.

Moreover, the total leakage current 215 has a function relationship with the limit 414 of a dangerous level, and thus the dangerous index 227 may be obtained by using the total leakage current 215. Preemptive measures may be taken based on the dangerous index before an accident occurs.

10.4 Detection of Leakage Current of Power Grid and Prevention of Ungrounded Electric Shock A conventional leakage current blocking technology refers to a technology of detecting a leakage current by detecting unbalanced current between lines and has been widely used as a means that prevents electric shock accidents. However, because the ungrounded leakage current between active lines of a charging unit is not distinguished from a normal load, electric shock may not be prevented.

A conventional technology is effective against ground faults, but an ungrounded leakage current is not detected. However, the conventional technology does not have special countermeasures for a light short circuit electric shock between active charging lines. As shown above, a current flowing due to a short circuit accident is incapable of passing through a load current meter, and thus the current is not considered as a load current.

The inventive concept may measure the leakage current caused by all abnormal loads by including a ground-fault current. It is possible to detect an ungrounded light short circuit between active charging lines or an electric shock by including a ground-fault current.

The current includes a ground-fault current, an ungrounded leakage current, which is caused by a decrease in dielectric strength between active charging lines, and an electric shock current in case of an electric shock accident. However, the current is almost unaffected by serial faults caused by parasitic resistance such as poor connection. Accordingly, when the current exceeds a specific value, an accident occurs. In the inventive concept, a leakage current may be known before an accident occurs, and thus it is possible to know the progress of a leakage current/short circuit accident. In other words, it is possible to quantitatively detect abnormal symptoms of accidents caused by a leakage current. Besides, it may be determined how close the current approaches a predetermined threshold limit.

Furthermore, the charging line leakage current detection technology may adjust the sensitivity when a threshold limit is variably set upon designing a safety circuit breaker. Damages caused by mistakes may be minimized in a power grid thus temporarily installed, such as a construction site where a line on which it is difficult to maintain the integrity of a power grid is exposed. The sensitivity control function may be usefully used in a power grid thus temporarily installed by setting the sensitivity to be high at the beginning of power-on, and adjusting the sensitivity appropriately when safety is identified. In the meantime, in a leakage detection method, a method for detecting a leakage current may be designed more sensitively than a method for detecting a dissipated power, and thus damages may be minimized in an event of a light short circuit or an electric shock.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 illustrates line loss power, load power, total power consumption, and a line voltage drop according to a line resistance change;

FIG. 7 illustrates a function of a line voltage and line resistance (measurement of line resistance);

FIG. 9 illustrates a function of a line voltage and an allowable maximum current (measurement of an allowable maximum current);

BEST MODE

Figure 1:
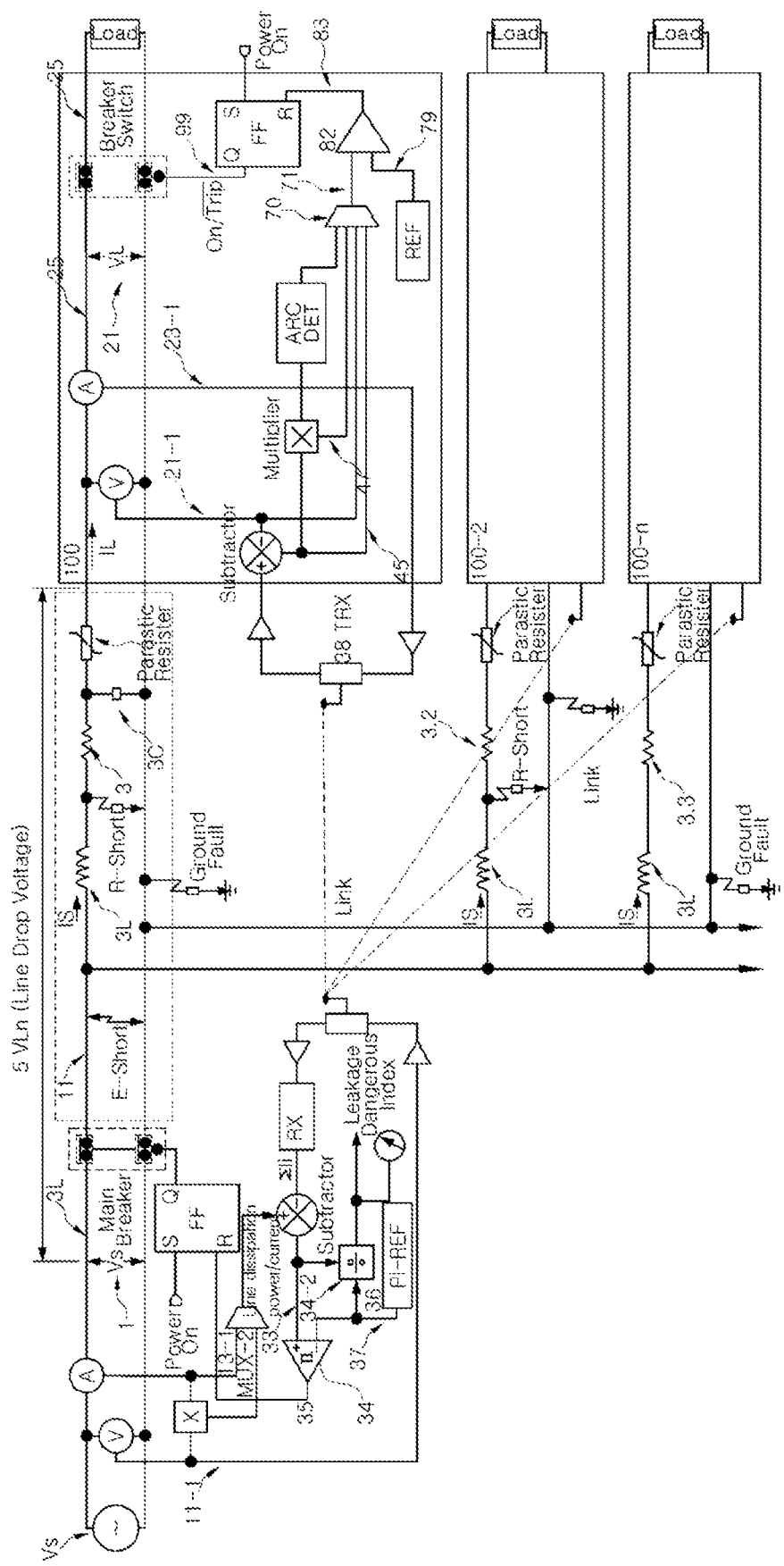
FIG. 1 is a conceptual diagram of a line fault detection system, according to an embodiment of the inventive concept.
Figure 2:
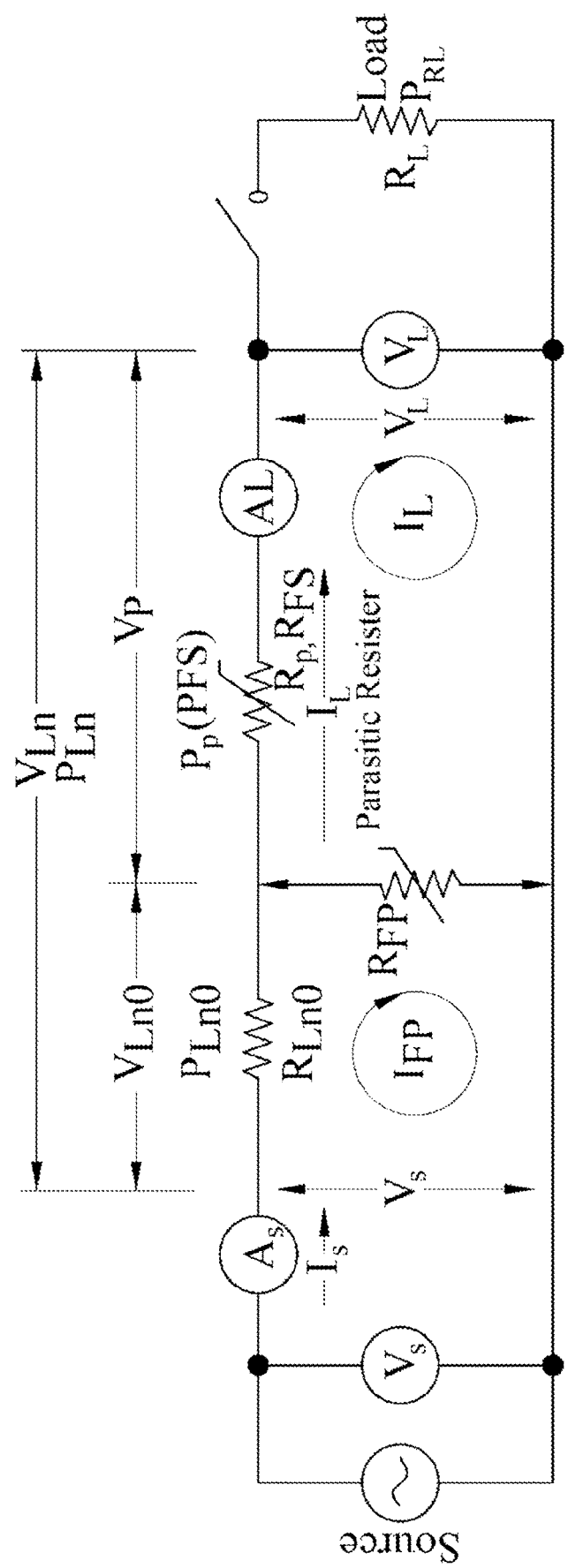
FIG. 2 illustrates modeling of series-parallel faults of a representative line having parasitic resistance.
Figure 3:
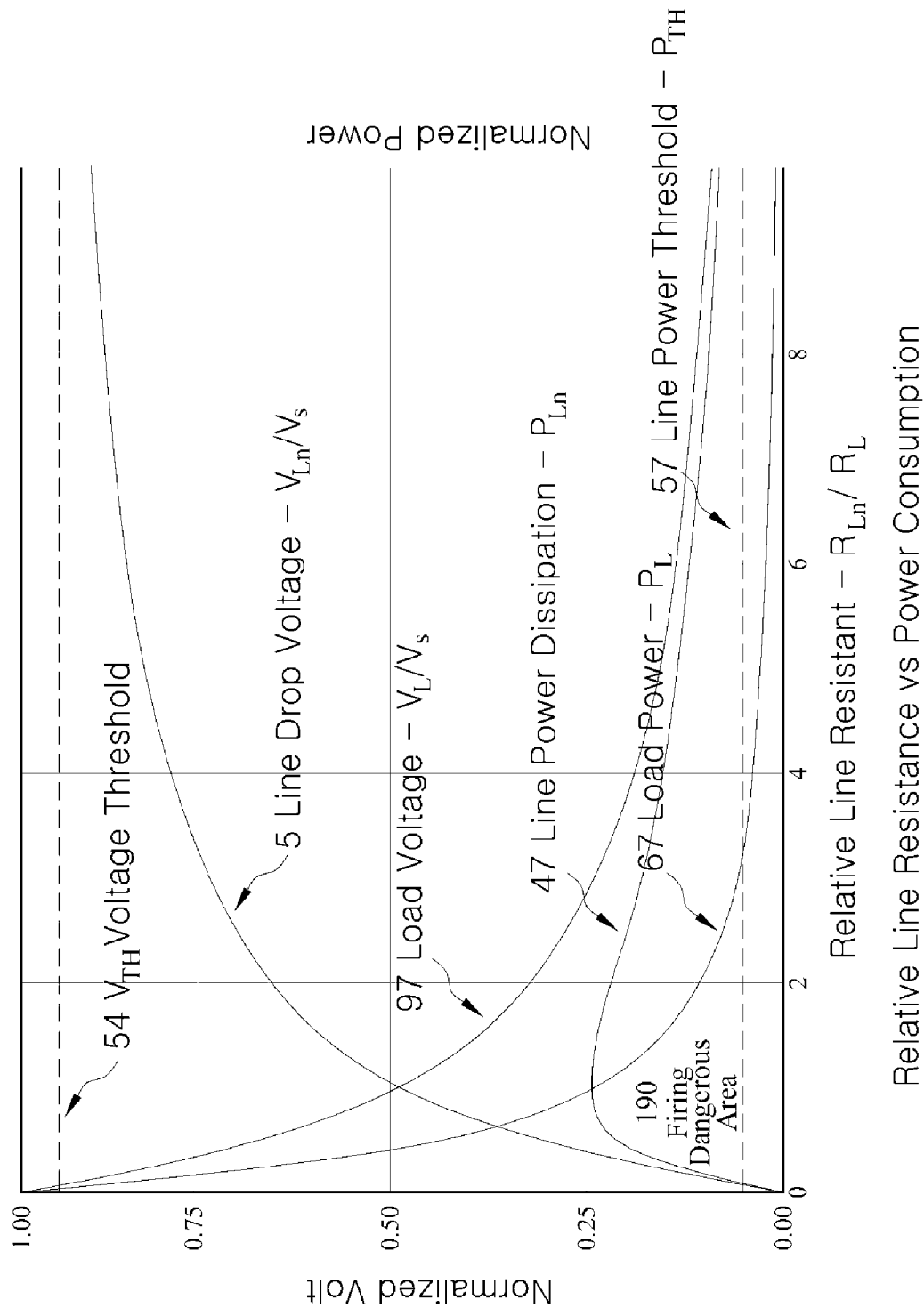
FIG. 3 illustrates an effect of parasitic resistance on a power grid.
Figure 5:
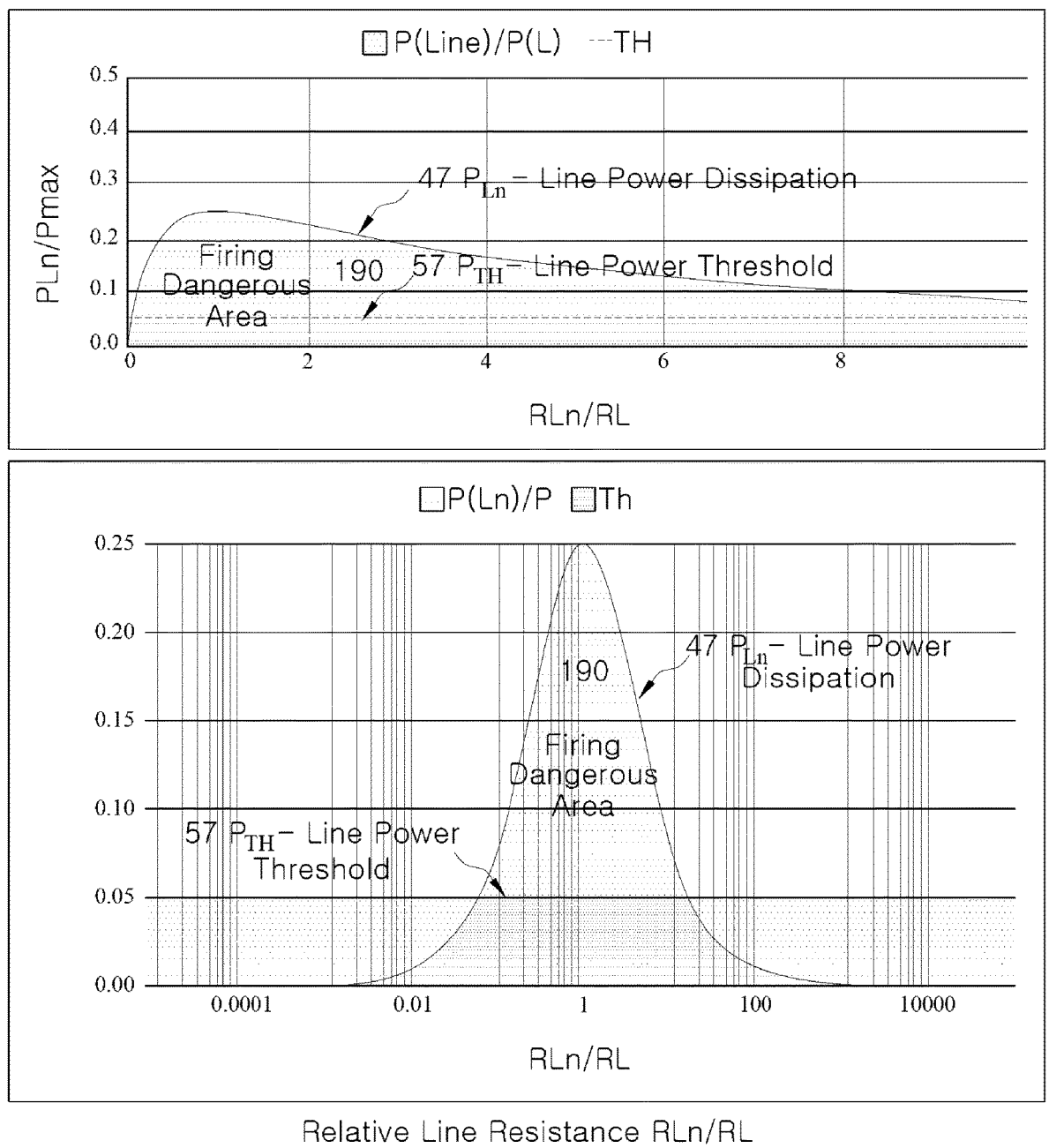
FIG. 5 illustrates power dissipated in a line due to deterioration of a power grid.
Figure 6:
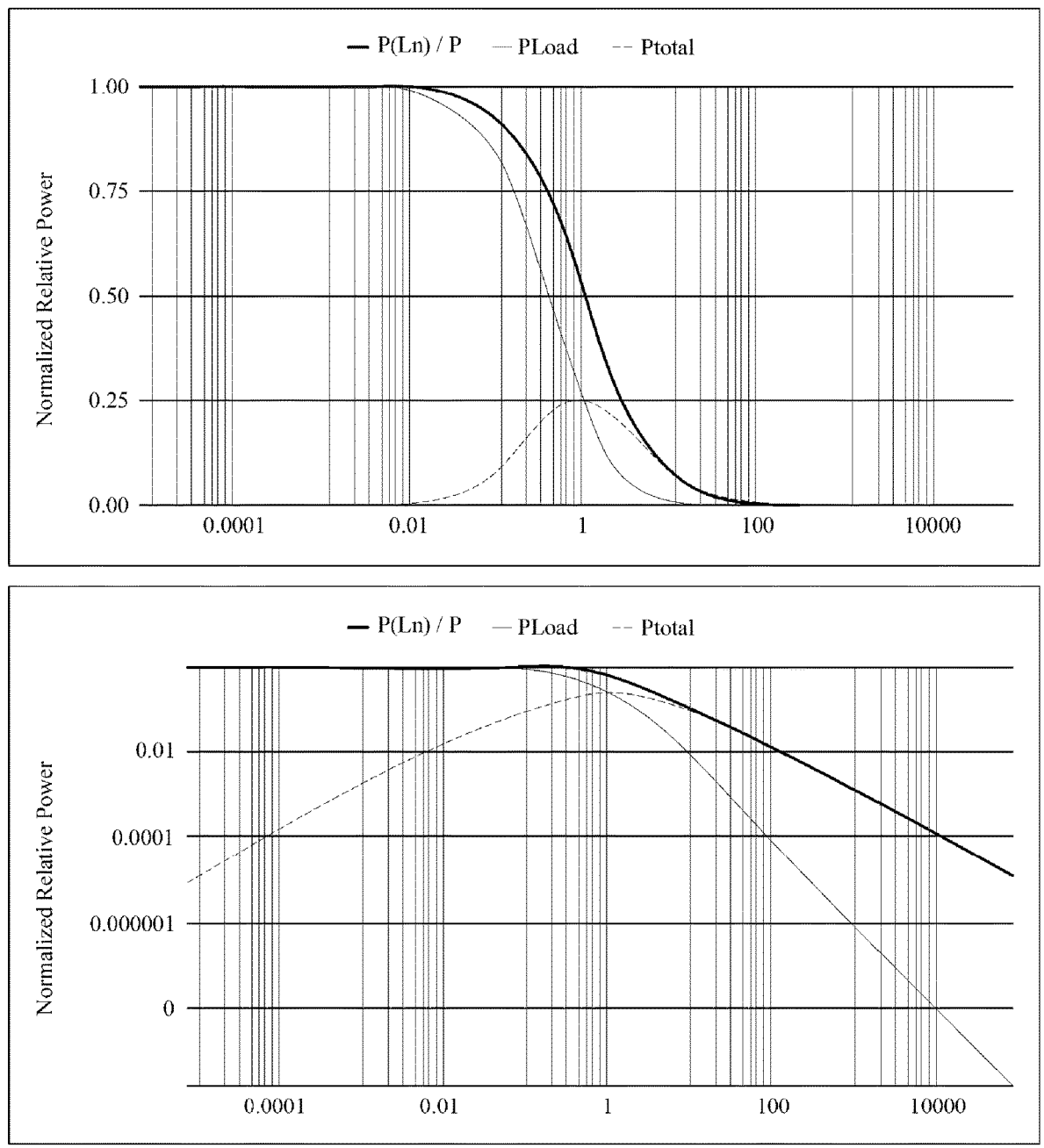
FIG. 6 illustrates a change trend in line loss power, load power, and total power consumption due to deterioration of a power grid.
Figure 8:
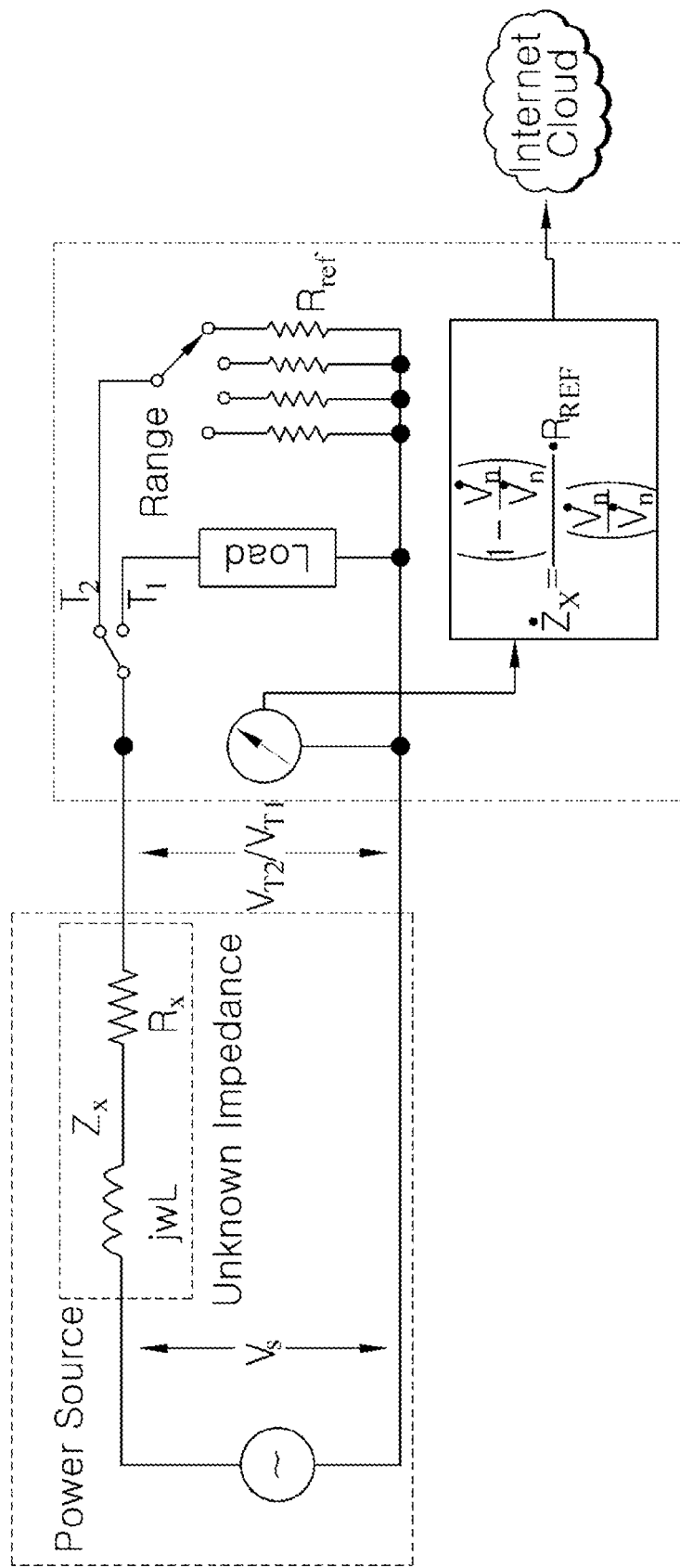
FIG. 8 is a conceptual diagram of measurement of remote line resistance.
Figure 10:
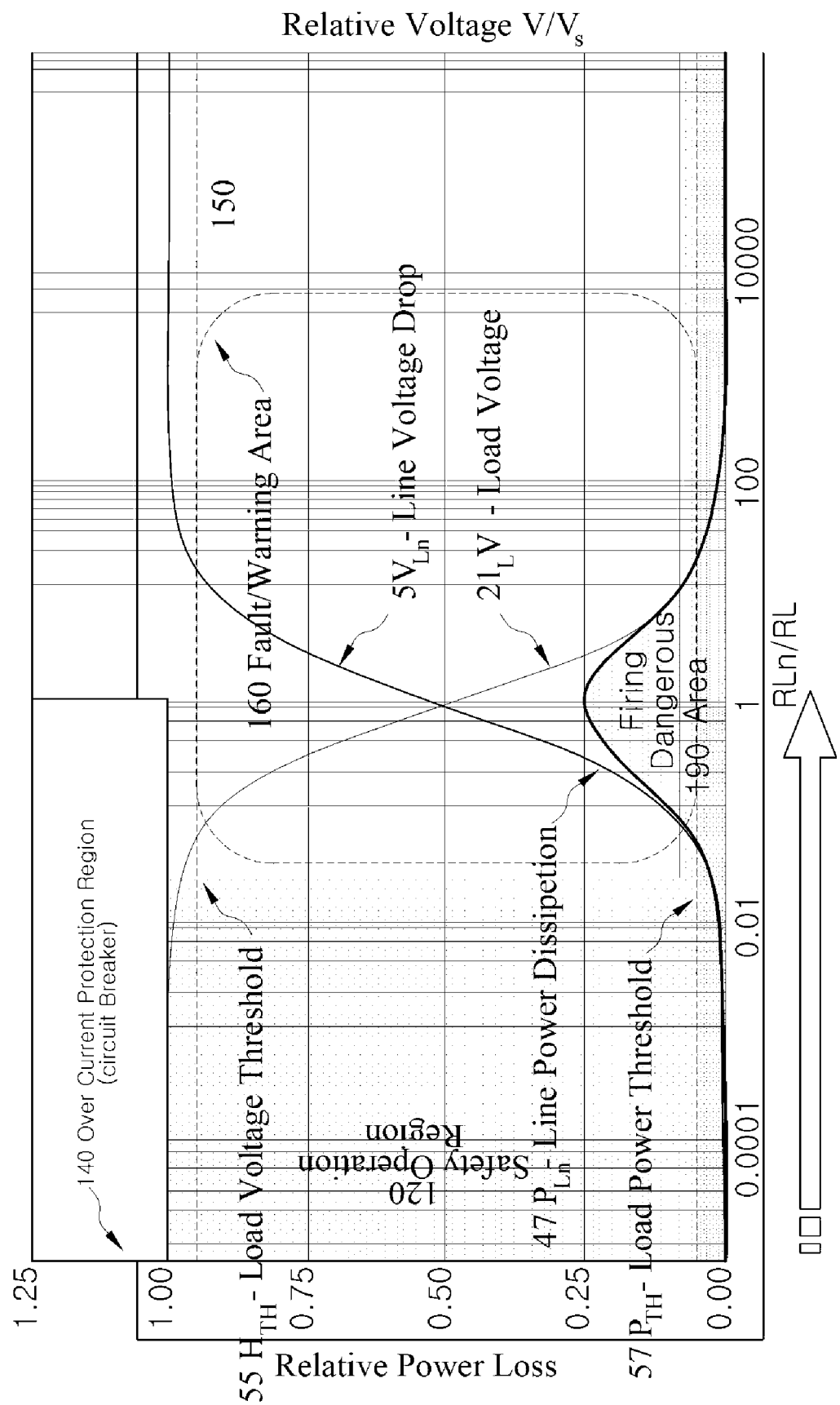
FIG. 10 illustrates a functional of line resistance increase and line loss power and protection region.
Figure 11:
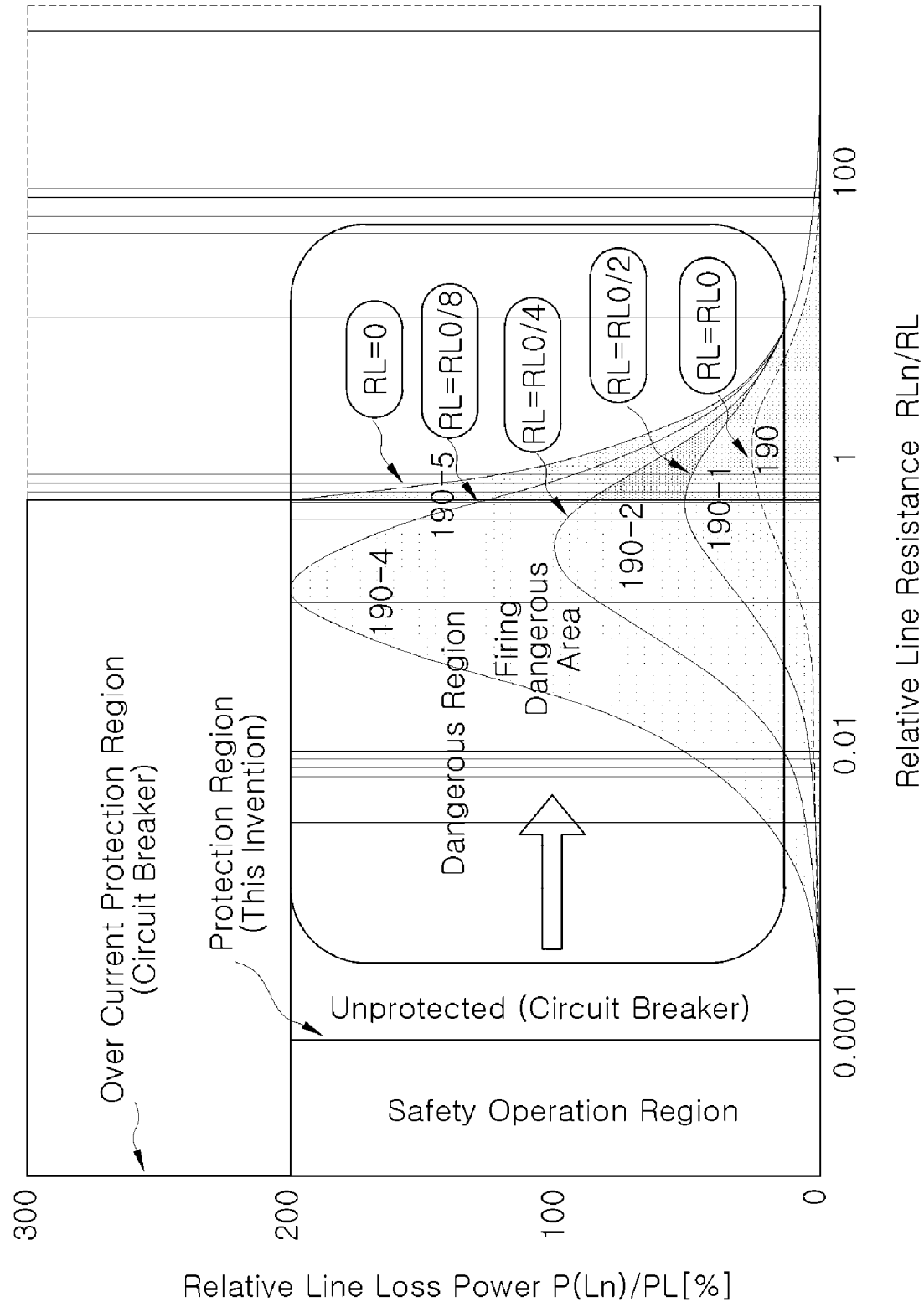
FIG. 11 illustrates a protection/non-protection dangerous region when a rated load of an overcurrent circuit breaker is exceeded.

FIGS. 13 to 18 show an embodiment of a detector for detecting a fault in a power grid, according to an embodiment of the inventive concept. In a power control network that supplies power (electrical energy) by connecting components in a subordinate (hierarchical) structure in order of "a power supply (a supply source)→a control node (an upper node)→a power grid (a line)→a control node (a lower node)→a load (a consumer end)". Each of the components is connected in a structure that functions two roles of power (input) and load (output) depending on an energy flow. At least one or more lower nodes and at least one or more loads are present.

Each control node includes a measurement means for measuring energy (power information) passed through each control node, a communication means for exchanging messages between control nodes, and a control means for controlling or alarming an output. The control nodes may communicate with one another. Each of the control nodes has a function of measuring and controlling energy (power information) passed through its own node.

The control node minimizes disasters by measuring/monitoring and controlling faults of a power grid in the following method.

(1) The upper node provides electrical information (voltage) of the upper control node to the lower node (feed forward).
(2) The lower node calculates a voltage difference with the upper node and controls a load depending on the calculation result.
(3) All lower nodes pass through all the lower nodes or measure energy (power and current) consumed by all the lower nodes and provide the measured energy to the upper node (feedback).
(4) The upper node sums up all energy measurement values delivered to a plurality of lower nodes.
(5) The upper node derives a result obtained by calculating/comparing an energy (power or current) measurement value of the lower node and an energy (power or current) measurement value passing through the upper node (a step of obtaining lost energy (power or current)).
(6) The upper node controls the output depending on the derived result or controls the output to be delivered to the outside.

Here, the control refers to a method of comparing the measured value with a threshold (a predetermined specific value) and blocking an energy supply to the lower node depending on the comparison result or sending a warning.

A fault in a power grid may be progressive or sudden (random). In particular, when the fault is progressive, abnormal symptoms of a power grid may be detected in a method of observing the trend of an output change, and thus disasters may be predicted, and preemptive measures against disasters may be taken. In other words, it is possible to prevent disasters in advance by maintaining the integrity of a power grid by taking preemptive measures depending on the detection result.

Embodiment of Node Controller

A configuration of an association mechanism controls the supply and distribution of energy at two or more remote points (nodes) connected to a power grid, and is physically separated into two or more devices, but coupled functionally. The configuration includes a measurement means for measuring a voltage of a node and power information (current or power) passing through the node, an output transmission means for transmitting the power information to the outside, a calculation means for comparing the voltage of the node and a voltage thus externally input, and calculates a voltage difference between the voltage of the node and the voltage thus externally input, a comparison means for comparing the voltage difference with a threshold, an external information collection means for collecting and summing pieces of external power information (power and current), and an output means for calculating or comparing power information of the node with the collected external power information, and outputting a control amount depending on the calculation/comparison result. A power control device is configured to control an output by measuring the dissipated power or leakage current of a power grid.

DETAILED DESCRIPTION

1. Embodiment

Figure 22:
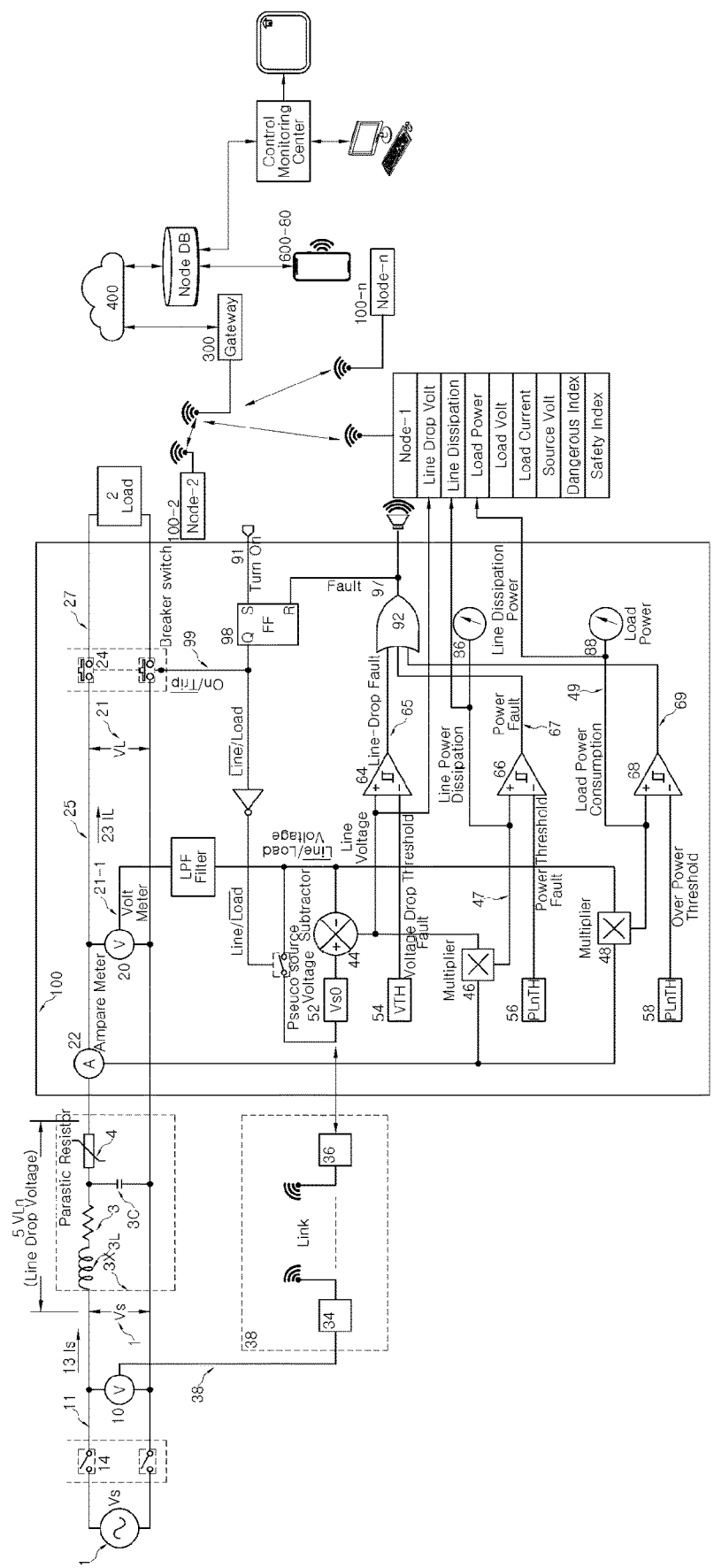
FIG. 22 illustrates an embodiment of a standalone control system connected to an IoT-cloud network.

FIG. 22 illustrates an embodiment of a protector for preventing an accident by monitoring abnormal symptoms of a line fault, such as line voltage drop, a change in line loss power, and exceeding of a limit of load power. The protector performs the following operations.
1. Initializing setting of each threshold (54, 56, 58) that is a criterion for determination.
2. Measuring a no-load line voltage 21 and storing the measured result in a virtual power register 52.
3. Supplying power to the load 2.
4. Updating a threshold of the virtual power register 52 when it is possible to measure the voltage 11 of the feed end.
5. Calculating the line voltage drop 45 and cutting off a power supply to a load when the threshold 54 is exceeded.
6. Obtaining the line loss power 47 by multiplying the drop voltage 45 by a load current 23-1.
7. Cutting off a power supply to the load and activating a protector when the loss power 47 exceeds the power threshold 56.
8. Calculating a load power 49 by multiplying a load voltage 21-1 by the load current 23-1.
9. Cutting off the power supply to the load and activating the protector when the load power 49 exceeds the power threshold 58.
10. Providing an alert. Faults may be detected by measuring a physical quantity, to which electrical properties of a line due to a current flowing through the line is reflected, and analyzing the measured physical quantity through repeating infinitely operations from step 3 to step 10. To prevent accidents that may occur on the line, appropriate follow-up processing may be performed when abnormal symptoms occur.

Here, follow-up measures may allow analysis, repair and recovery action of a fault cause to be performed by variably providing a warning depending on the degree of an abnormal symptom, cutting off a power supply or notifying a control system or a person of an extent of a line fault.

To cope with a case where a system is confused because the system is capable of obtaining a power voltage, which is the standard of control, due to communication problems, the no-load voltage is regarded and treated as the power voltage in an initialization process. Afterward, when the feed end voltage is capable of being obtained normally, the feed end voltage may be updated and processed as an actual power voltage.

Figure 12:
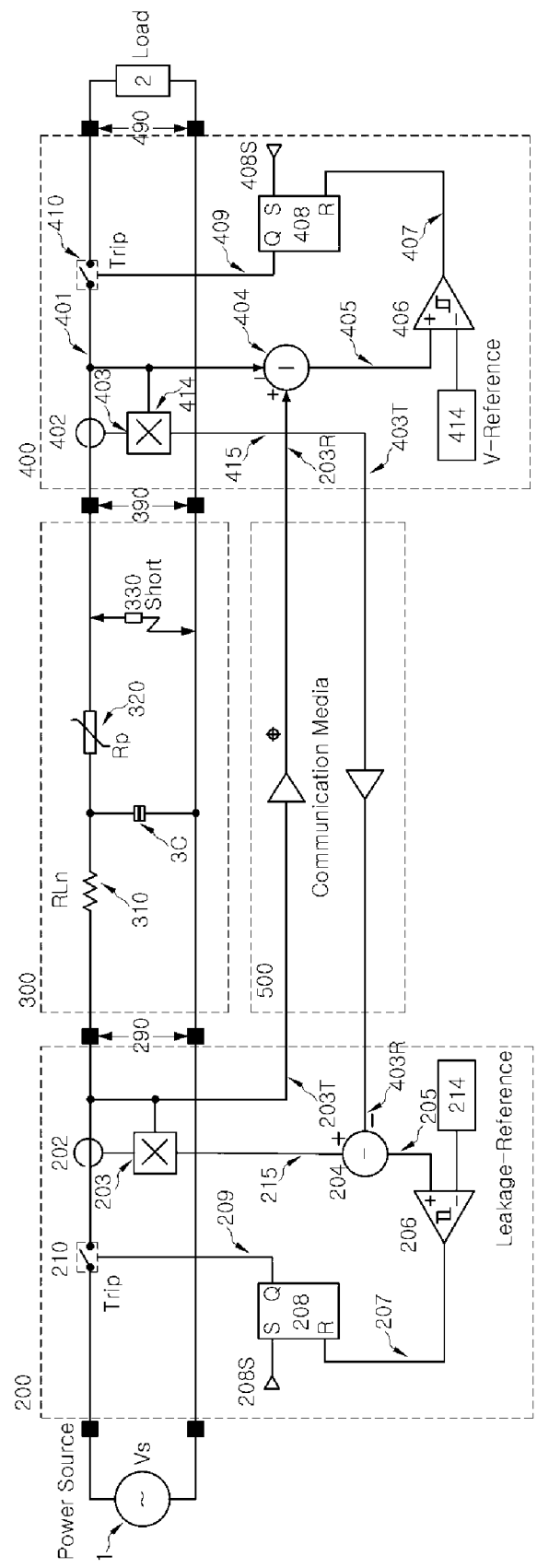
FIG. 12 illustrates measurement of a dissipated power of a power grid.
Figure 13:
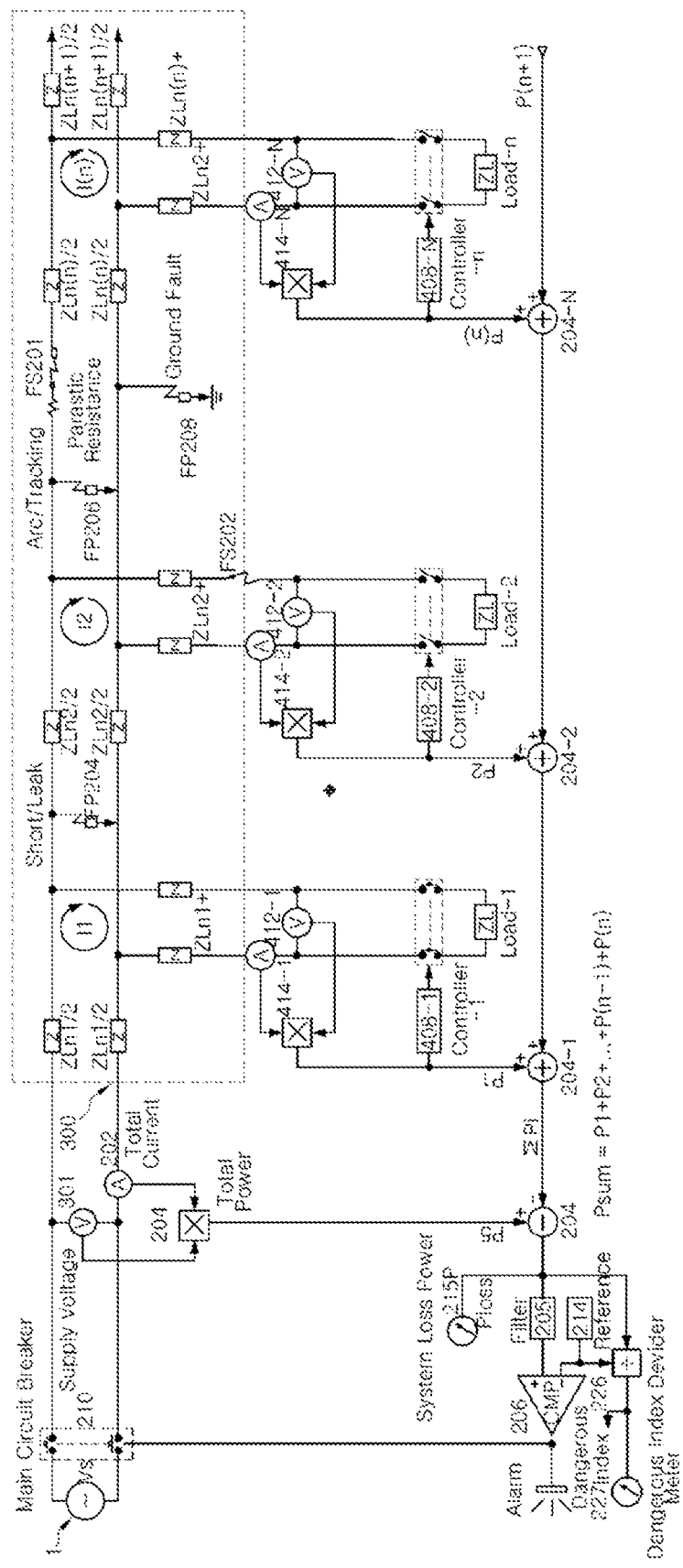
FIG. 13 illustrates measurement of a dissipated power of multiple loads on a power grid.
Figure 14:
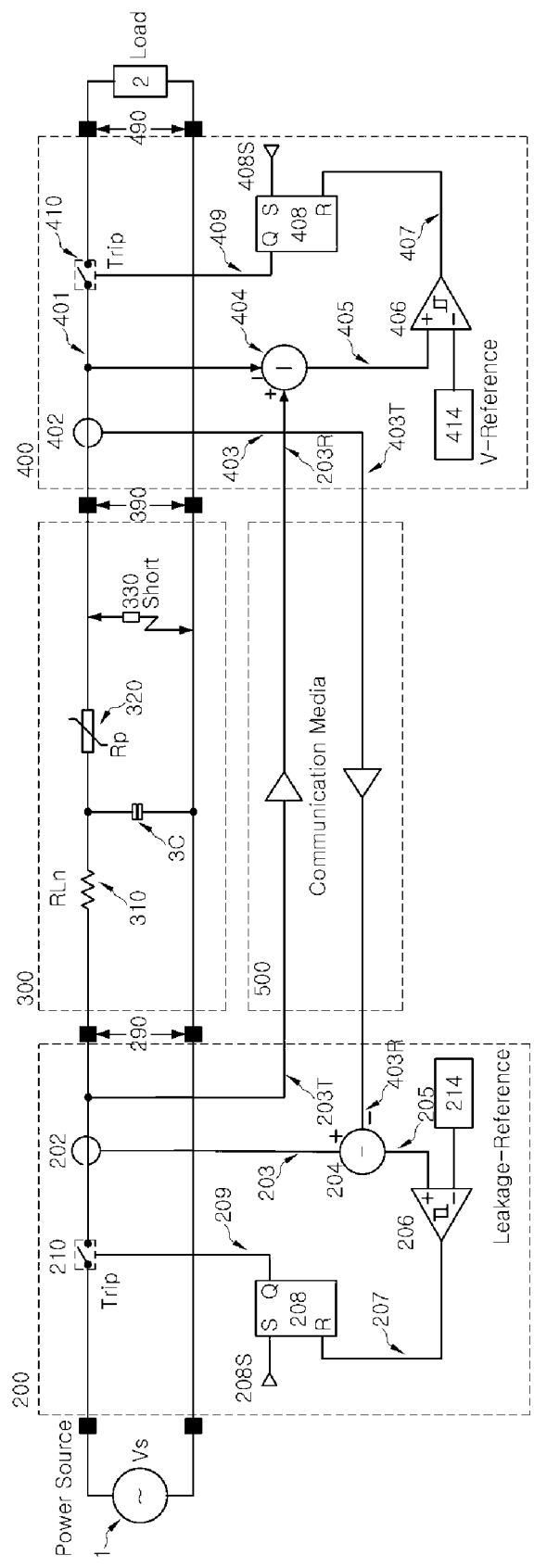
FIG. 14 illustrates detection of a leakage current or a short circuit of an active wire charging line and detection of a leakage current (detection of electric shock)
Figure 15:
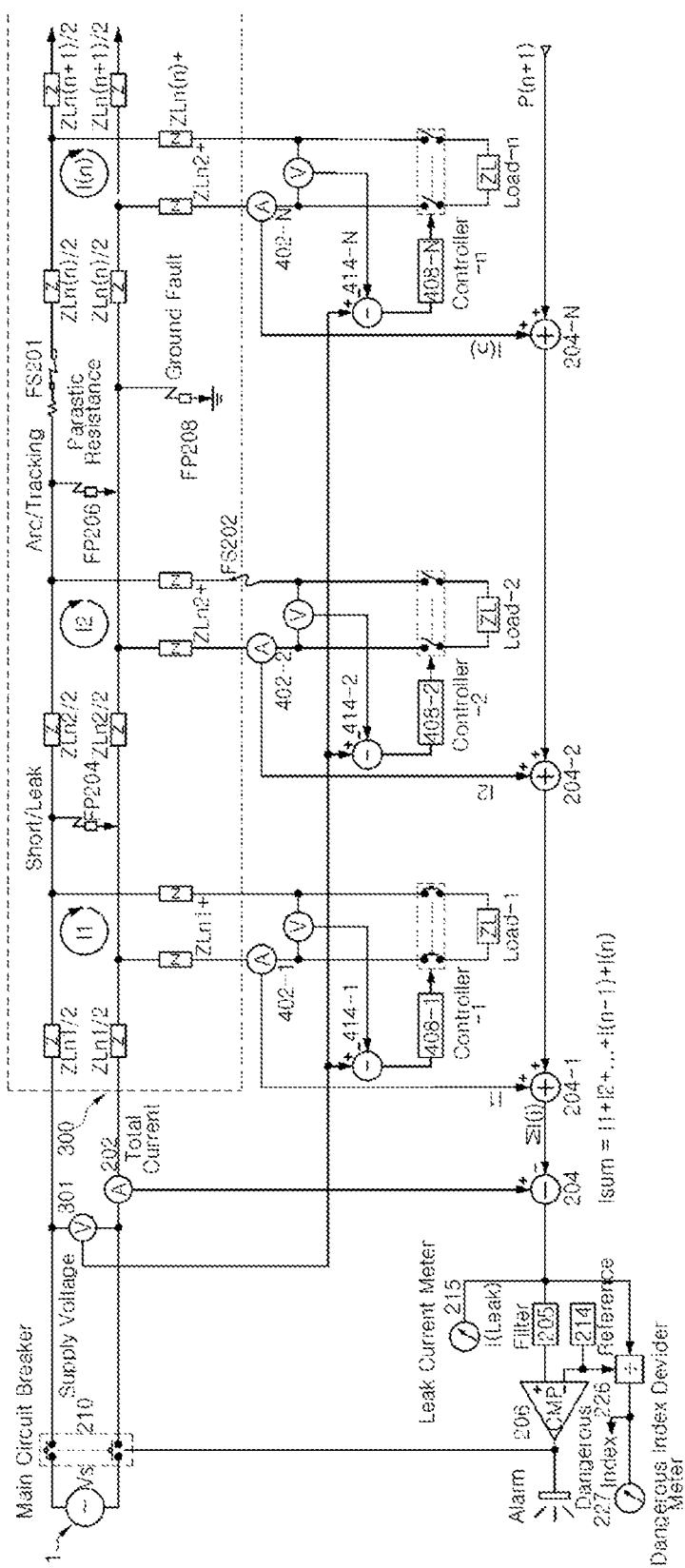
FIG. 15 illustrates detection of a leakage current or a short circuit of an active wire charging line on a power grid having multiple loads.

FIGS. 1 and 12 are schematic diagrams of an embodiment indicating an operating principle of the inventive concept. Although being expressed as a hardware circuit composed of various elements, most of components such as the measurement means and the control means may be implemented by a microprocessor and software.

A fire abnormal symptom detecting method according to an embodiment of the inventive concept includes a method of detecting line loss power, accumulated energy loss, or a line voltage drop.

In addition to two voltage measurement means and one current measurement means, a communication means for transmitting data obtained by an analog-digital converter (ADC) to a processing end may be included to perform digital discrete processing. The operating principle of the inventive concept performs the following operations.
1. Setting the threshold 58, which is an allowable upper limit of loss power and which is a criterion for determining dangerous situations.
2. Converting a voltage and a current at opposite ends into digital data (A/D) to measure the power of a feed end and a receiver end.
3. Collecting the data thus digitally converted from a processing means.
4. Extracting the power 47 (line loss power) lost in a line by multiplying the current 23 and the difference 45 in a voltage between opposite ends, which is obtained by subtracting the voltage 21 of the receiver end from the voltage 11 of the feed end.
5. Comparing the line loss power 47 with the predetermined threshold 58.
6. Detecting abnormal symptoms of fire and preventing accidents in advance in a method of providing a warning or limiting the supply of dangerous power to the load 2 (a receiver end) when the line loss power 47 exceeds the threshold 58. A dynamic circuit breaker may execute a method for performing the following operations.
   (1) Setting an allowable voltage drop rate.
   (2) Cutting off a power supply to a load, measuring a no-load line voltage, and storing the measured value as a supply voltage.
   (3) Calculating the no-load line voltage and the allowable voltage drop rate and setting a threshold.
   (4) Supplying power to a load.
   (5) Measuring the load voltage supplied to the load.
   (6) Comparing the load voltage with the threshold.
   (7) When the comparison result indicates the load voltage is not reduced to the threshold or less, the dynamic circuit breaker repeats the operations from step (4) to step (6). When the comparison result indicates the load voltage is less than the threshold, the dynamic circuit breaker detects line faults (exceeding the allowable current capacity due to a change in electrical properties and deterioration) and cuts off a load in a method of limiting a power supply to the load.

In a fire prevention system having a threshold setting means 54 capable of variably setting a load blocking reference value 71, a feed end continuously measures a feeding voltage and transmits (broadcasts) such that the receiver end recognizes the physical quantity (1, 13) of the feed end, and a control means 40 performs operations depending on the following steps before the load 2 is powered by turning on the load control means 24 when an external turn-on signal 91 of a load is entered.

(1) After measuring and storing the no-load voltage 21 of the load end 25 before power is supplied to the load 2 when a control signal 99 is input to supply power to the load 2.

(2) Turning on the load control means 24 to supply power to the load 2, measuring a voltage and a current of a line 3X, and monitoring the degree of convergence to a predetermined threshold.

Here, when a line fault detection threshold is determined as a relative value depending on situations by calculating an allowable maximum line voltage drop rate and a power voltage, the line fault detection threshold may be dynamically and automatically determined without setting the line fault detection threshold to a specific value individually. Regardless of a power voltage and load capacity, the line fault detection thresholds may be more useful because the line fault detection thresholds may be dynamically applied to all loads. However, because the power capacity after an operation of the circuit breaker according to an embodiment of the inventive concept allows up to the maximum usable capacity of the line due to the prevention of faults on a power supply line, it is desirable to use the maximum load current as the current threshold to protect a load. The threshold of the maximum load current may not be automatically calculated because it is a natural power according to a need of a load.

The inventive concept is merely a technology for preventing problems occurring in a supply line, and may not detect or prevent faults occurring inside all kinds of loads. However, because measuring a load current/power, the inventive concept also provides a method of setting and using a threshold for determining an upper limit of a load current and blocking an overload based on a load power so as to be the same as the previous method.

(3) Measuring the load voltage 21 and a current 23 supplied to a load.

The inventive concept detects line abnormalities in the following four methods. When one or more line abnormalities are detected, the inventive concept determines that there is a line problem, and then takes follow-up measures. The inventive concept may detect line abnormalities in a variety of manners.

(a) Loss power of a transmission line.
   (b) An amount of power lost in the transmission line (accumulated power loss in a section).
   (c) A voltage drop of the transmission line.
   (d) Impedance of the transmission line.
   (4) Measuring the feed end voltage 1, transmitting the feed end voltage 1 to the control means 40, multiplying normal data and an allowable voltage change rate 54 when the control means 40 receives the normal data, and updating the threshold stored in RDmax 54, which is a reference value of determination.

(5) Obtaining a line voltage drop (31, 45) from the feeding voltage 1 (or the stored no-load voltage 21 and the stored current load voltage 21-1) of the feed end 11, comparing the line voltage drop with a predetermined threshold 71, determining that a fault is present on a line, when the line voltage drop is reduced to the threshold or less, and cutting off power supplied to the load 2.

(6) Calculating the line voltage drop (31, 45) from the feeding voltage 1 (or the stored no-load voltage 21 and the stored current load voltage 21-1) of the feed end 11, multiplying the line voltage drop by the load current 22, and calculating a loss power 85 lost in a line.

(7) Comparing line loss power 65 and a predetermined threshold 74, when it is determined that a fault is present on a line, by determining that the line loss power 65 exceeds the predetermined threshold 74, and cutting off the power supplied to the load 2. The inventive concept prevents accidents through the operations.

2. Second Embodiment

A stand-alone model, which is simply provided because it is difficult to obtain a power voltage at a remote feed end, regards and treats a no-load voltage as a power supply voltage in an initialization procedure.

For the purpose of solving problem that occurs in the stand-alone method, it is possible to transition to a no-load state, in which a load is temporarily cut off to identify an error according to a condition change of the feed end when the first trip condition occurs, to measure a no-load voltage, to examine the stability of a voltage at the feed end again. When the cause of the trip signal is not a fluctuation in a power supply voltage, it is determined that a fault is present in a line. Alternatively, when the cause of the trip signal is the fluctuation in a power supply voltage, it is possible to update the no-load voltage value and to perform an initial power-on procedure again. Through this operation, malfunction and reliability degradation may be prevented. Afterward, for the same load, the data learned by the procedure may be reflected to setting a threshold. That is, it is possible to analyze and learn a change pattern of a load current, to derive a threshold suitable for a load condition, and to dynamically change the threshold in conjunction with a pattern of the load current.

To obtain loss power in a single serial line connecting a feed end to a receiver end, the loss power of a line may be obtained from a relationship of "$P_{Ln}(i)=P_S-P_L(i)$", by measuring a voltage and a current at opposite ends and calculating power.

FIGS. 1 and 12 show an example of detecting a fault and installing a control device at a receiver end according to an embodiment of the inventive concept.

$$P_{Ln}(i) = P_S - P_L(i)$$
$$= (V_S - V_L(i)) \cdot I_L(i)$$

The line loss power may be calculated by measuring and calculating a voltage of the feed end, a voltage of the receiver end, and a load current (basically related to the line loss power). However, when the feed end and the receiver end (load) are physically separated from each other, a new additional line is required. Accordingly, the installation of an additional line for applying the principle is not practical because it is not realistic. However, the recent development of a wireless communication technology may easily solve this problem. As a highly realistic technology, it is possible to implement a highly practical disaster prevention system by using a wireless IoT technology. (It is based on the basic principle expressed in the following equation.)

Even when the real-time power voltage 1 of the feed end is incapable of being measured, or a transmission error occurs between the feed end and the receiver end, it needs to perform a basic function independently (stand-alone).

To this end, until a situation is changed and the no-load line voltage ($V_{L0}$) of the receiver is updated to a new value, the no-load line voltage ($V_{L0}$) of the receiver end is treated as a reference value by regarding (replacing) the no-load line voltage ($V_{L0}$) of the receiver end as the voltage (1, 15) of the feed end. When the load is turned on, the no-load line voltage ($V_{L0}$) of the receiver end is maintained as a voltage just before the load is turned on. When the load is cut off, the value is updated in real time.

However, this method causes an error when the voltage of the feed end 11 is changed. In a state where a load is activated, exact properties, for example, whether the voltage of the feed end is changed, or whether line properties are changed, are not identified, and thus some problems may occur. When the voltage 1 of the feed end fluctuates severely, precise operation is impossible. However, when the power of the feed end is stable, a structure is simple because an external measurement means 10 and a communication means (34, 36) are not used to measure the voltage of the feed end. The following equation supports the explanation.

$$P_{Ln}(i) = P_S - P_L(i)$$
$$= (V_S - V_L(i)) \cdot I_L(i)$$
$$= V_{Ln}(i) \cdot I_L(i)$$
$$\cong (V_L(i_0) - V_L(i)) \cdot I_L(i)$$

$V_{li}|_{I_{li}=0} = V_S$: Pseudo Supply Voltage

To prevent operation sensitive to noise or an inrush current, the amount of heat generated due to loss of line power may also be used as a reference value for determination.

$$H_{Ln(i)} \cong 0.24 \int_{T-\Delta T}^{T} (V_{Li}(0) - V_{Li}(t)) \cdot I_L(t) dt [Cal]$$

When the capacity of the power supply is insufficient or the feeding voltage fluctuates severely, an error increases in the approximation. However, because $V_{Li}(0)$ is a physical quantity that may be obtained in a no-load state where loads at the feed end and receiver end are removed from a network, $V_{Li}(0)$ has high practicality.

In the meantime, the loss power of a line series network is proportional to a voltage drop between opposite ends. Accordingly, even when there is no current measurement means, line faults may be detected. Even when a change ratio of a supply voltage to a load voltage is measured, line faults may be detected. In this case, because all line impedances are cumulative, information in a specific section is unknown, and thus the situation may be misjudged. However, it is possible to prevent accidents in a vulnerable portion that occurs due to the excess of the allowable capacity according to an increase of a load on a series distribution path.

4. Embodiment—Protection of Energy Converter

A basic concept according to an embodiment of the inventive concept may also be applied to the safety management of an energy converter such as a transformer in a power grid. In other words, it is possible to measure the power dissipated in the transformer in real time, such that safe operation information and dangerous level information is capable of being obtained. Accordingly, accidents such as explosions may be prevented.

Figure 16:
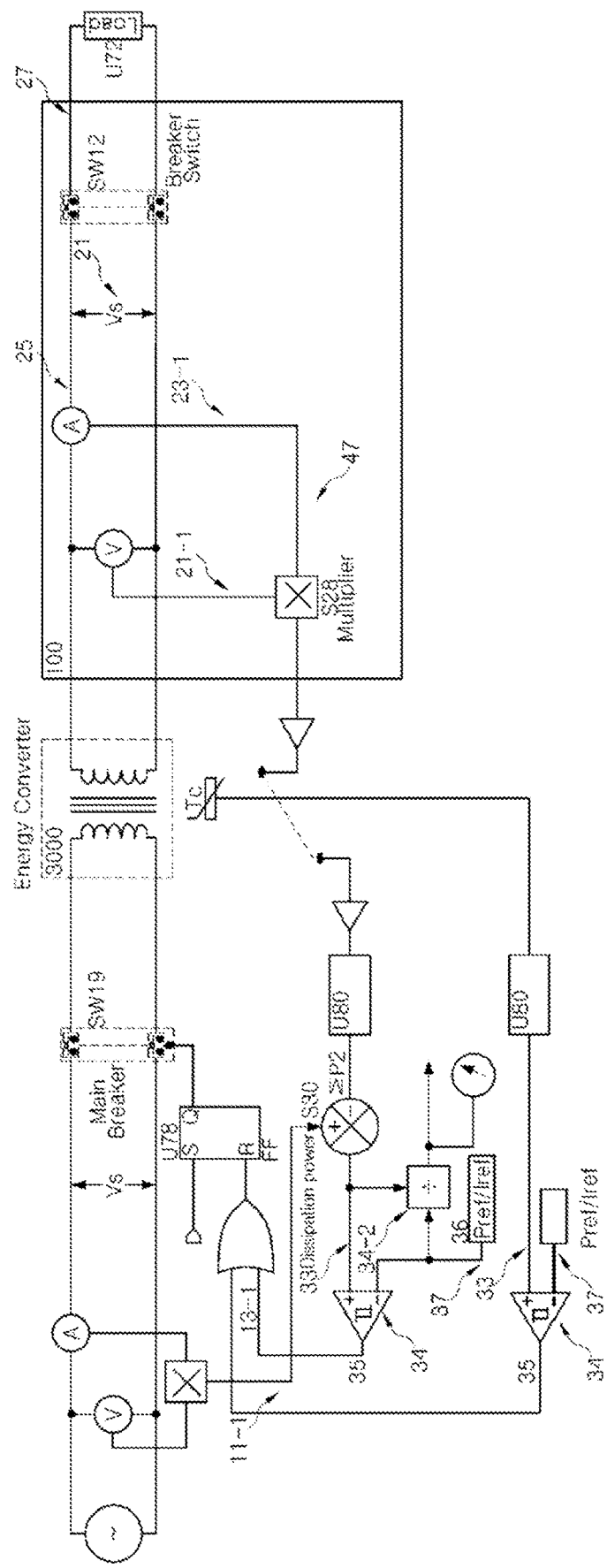
FIG. 16 illustrates an embodiment of a protection mechanism of an energy converter (transformer)
Figure 17:
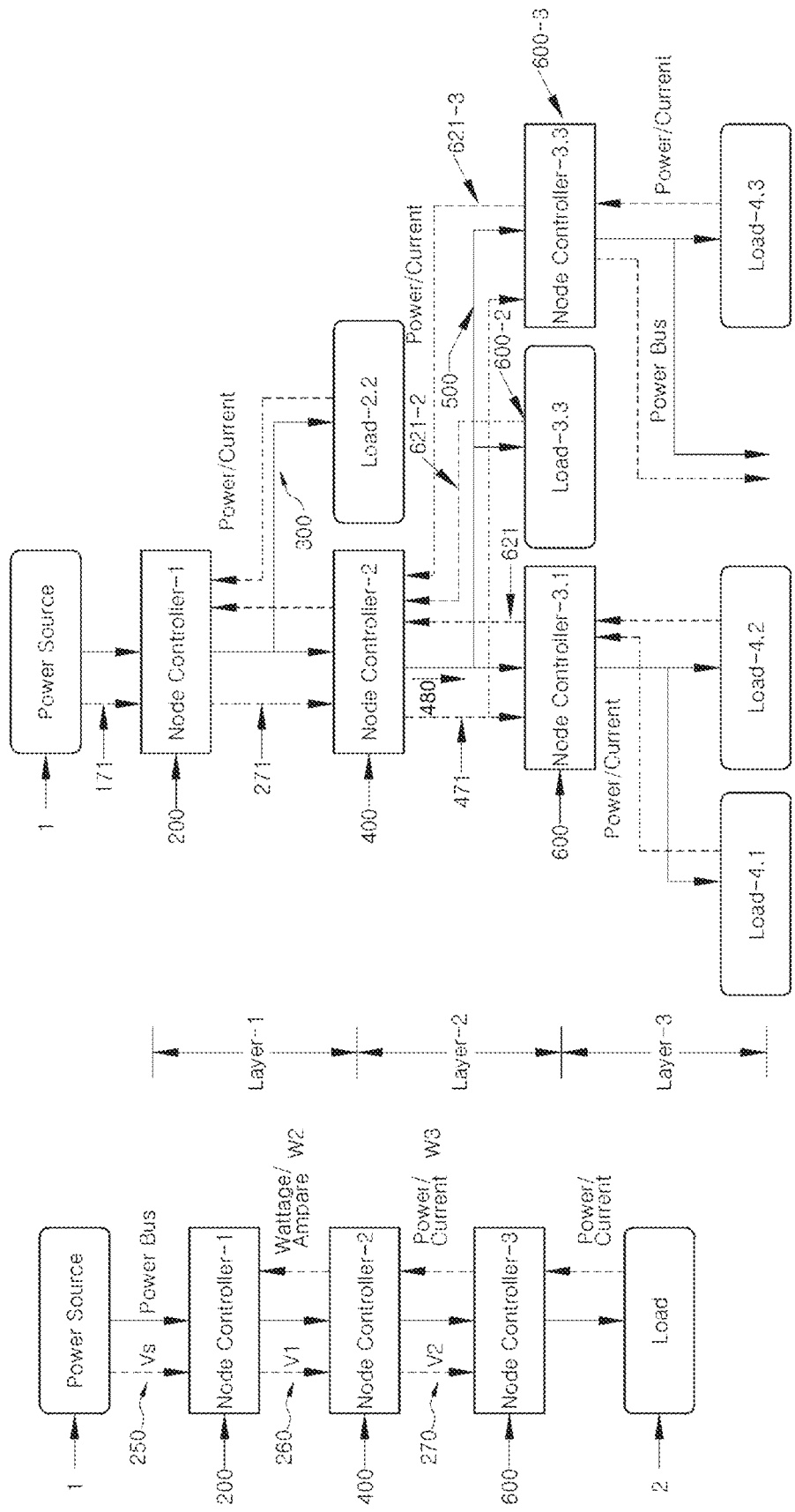
FIG. 17 illustrate an embodiment of a line fault detector.
Figure 18:
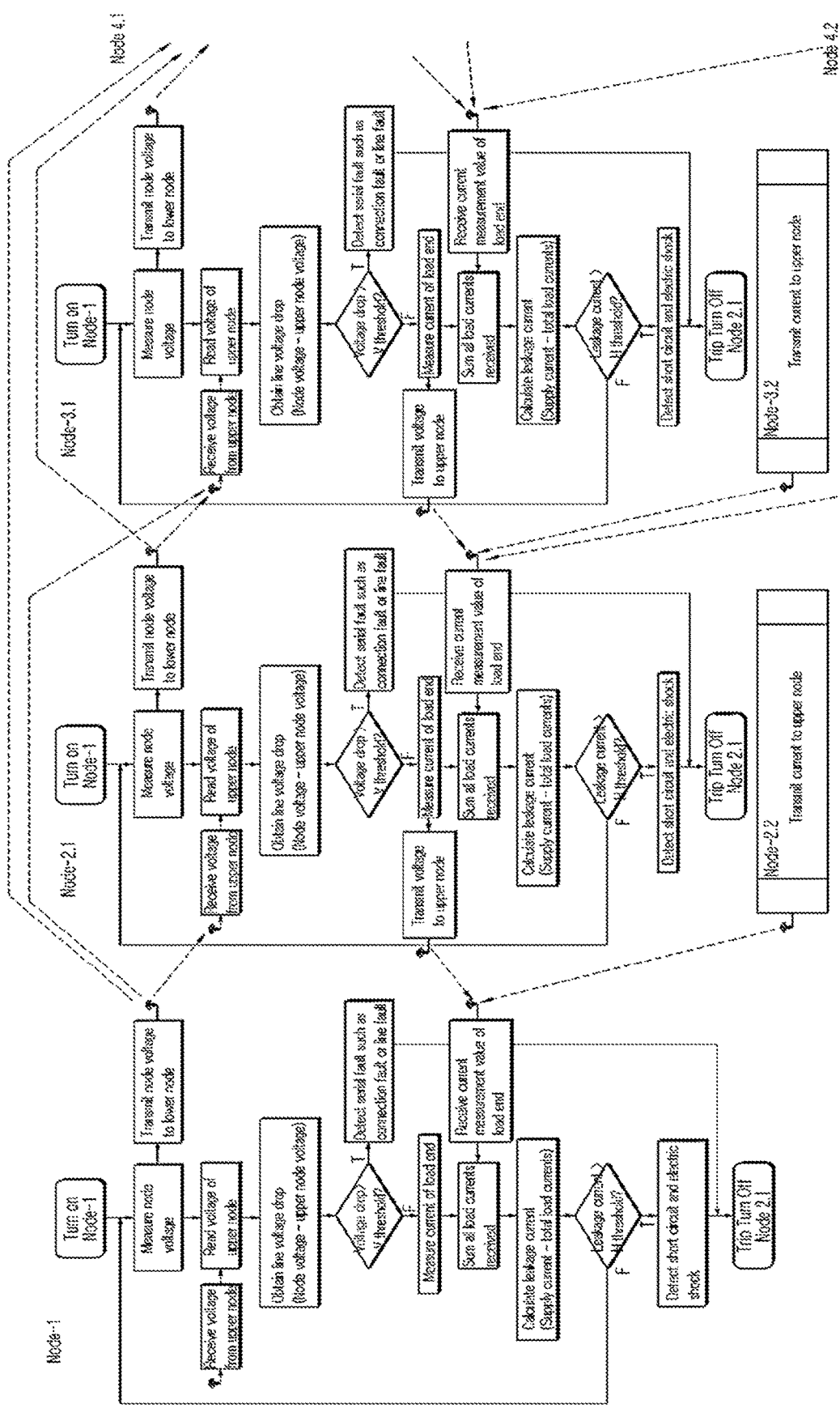
FIG. 18 illustrates an operation diagram of an associative control mechanism between control nodes.
Figure 19:
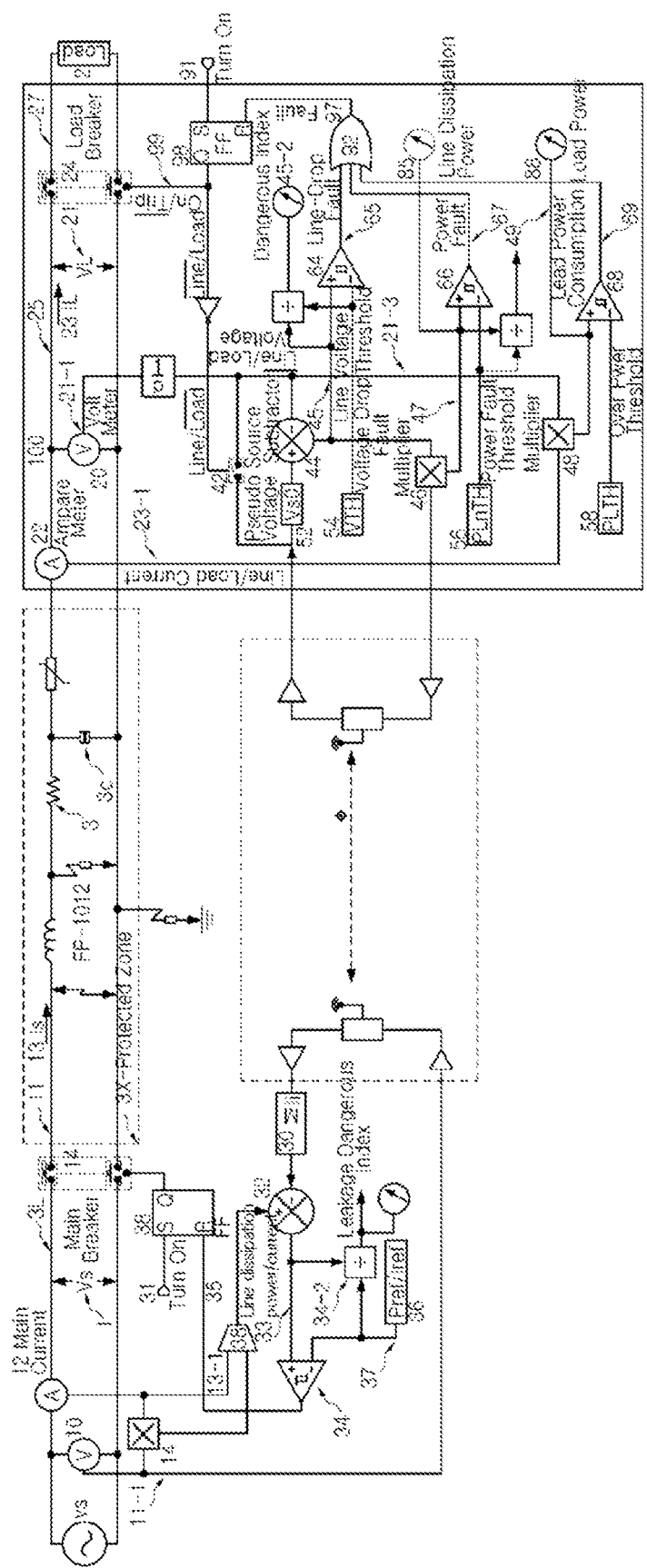
FIG. 19 illustrates an embodiment of a line fault detector having a single load.
Figure 20:
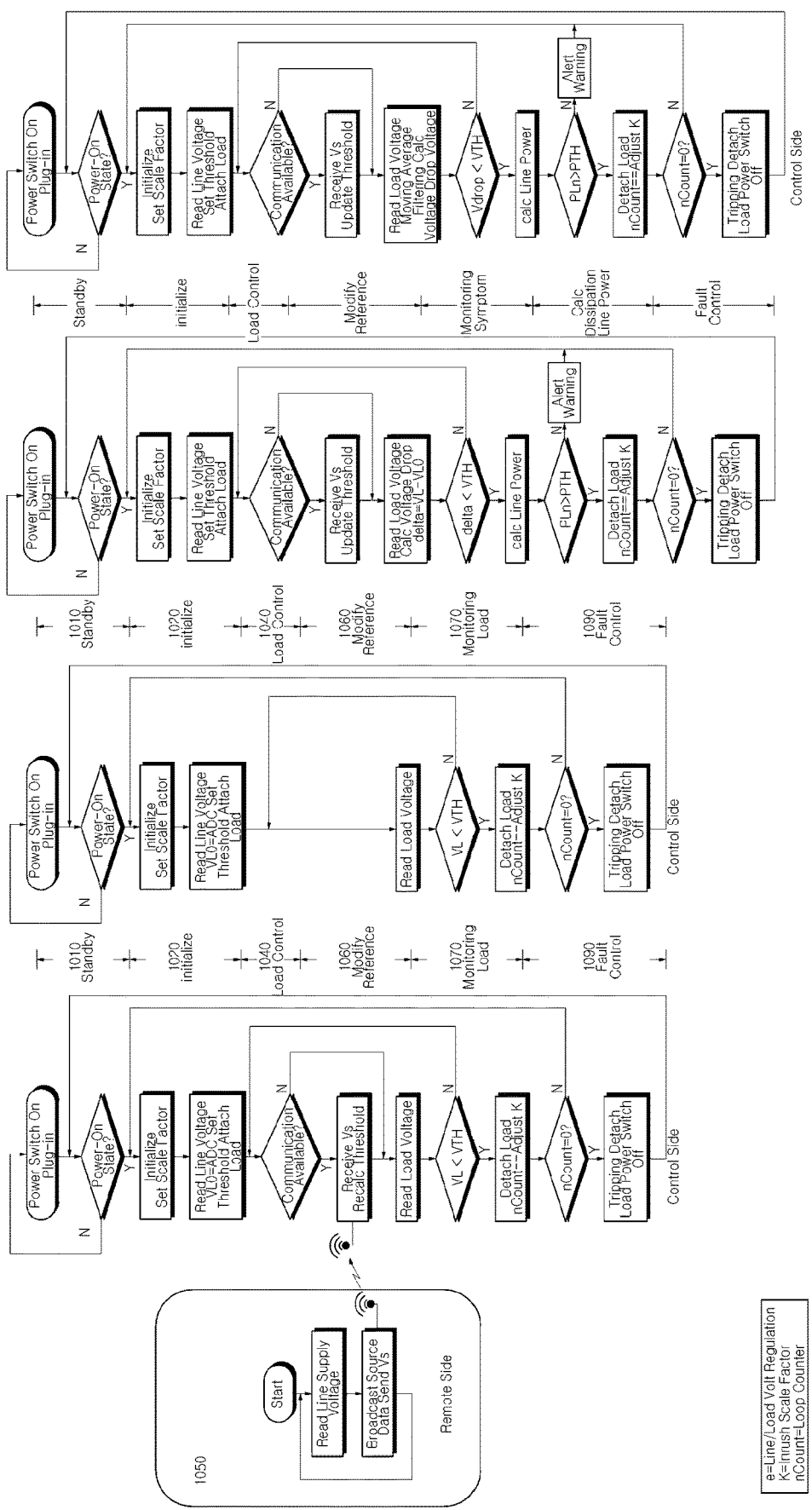
FIGS. 20A to 20E illustrate an operation diagram of serial fault detection of control nodes.
Figure 21:
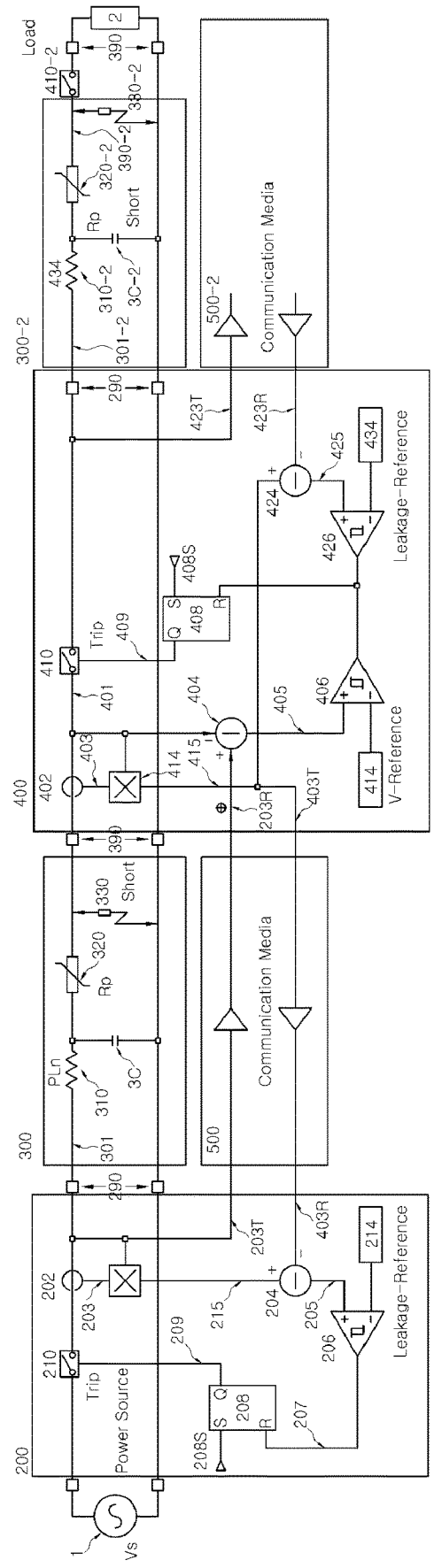
FIG. 21 illustrates a structure of a control node.

FIG. 16 illustrates that the inventive concept is implemented based on the idea of detecting a fault by detecting an energy loss of a power system, and is applicable to all fields of energy transmission conversion. For example, the main causes of accidents in a power converter such as a transformer 810, an inverter, or the like are analyzed due to inter-layer short circuits (812, 814), overheating, deterioration of insulating oil, a connection fault, and an overload. Appropriate measures are taken by detecting whether the physical quantity related to the above causes exceeds a threshold. However, because the method causes aged deterioration due to external conditions and aging/deterioration, the allowable maximum power is lowered. According to an embodiment of the inventive concept, to minimize these problems, when the limit power 214 is set with reference to the efficiency and loss power 205 of a converter, a safe operation is possible depending on aging. Moreover, an example of using an overheat detection 820, which is a symptom of deterioration of the transformer 810, is shown. When a status is appropriately reflected and monitored remotely through an IoT technology, proper operations are possible without additionally using complex sensors. In a method cheaper and simpler than the conventional method, the disaster prevention/monitoring system according to an embodiment of the inventive concept has a structure for easy remote management in conjunction with a smart grid technology. An example of an appropriate trip condition according to the degree of deterioration is shown below.

$$\text{Conversion efficiency: } \eta = \frac{P_2}{P_1}$$

$$\text{Loss power: } \Delta P = P_1 - P_2$$

$$\text{Allowable maximum power loss rate: } \rho_{TH}$$

$$\text{if } \left( ((P_1 - P_2) \geq ) \| \left( \frac{P_1 - P_2}{P_1} \right) \geq \rho_{TH} \right) \text{thantrip}();$$

The energy converter 3000 normally requires electrical insulation between an input and an output thereof. An input/output communication means 500 may adopt any means such as an RF method, an electromagnetic coupling method, and an optical communication method. However, an energy converter such as a transformer has an input and an output, which are close to each other, and requires high insulation withstand voltage, and thus a fiber optics communication method is advantageous when electromagnetic interference (EMI) is considered.

5. Power Control Domain

A power node (a power bridge controller) is a control device that receives (input) power from a power source (an upper power grid) and distributes power to a load (a lower power grid), and measures electrical information of a power transmission line and controls a power supply depending on a status. A power grid has a hierarchical structure, and has a hierarchical tree topology in which a shape of upper node-power grid-lower node is repeated. A physical branch without a node (bridge) according to an embodiment of the inventive concept is regarded as logically the same layer.

When the present node becomes a control target, layers are validly distinguished from one another. When a lower node is added to a power grid managed by a node, a node dependent on the power grid is considered as one load. In general, the power grid is physically in a form of a mesh, multi-point bus, and tree. In an embodiment of the inventive concept, a layer and a branch are classified based on a control node.

In FIG. 17B according to an embodiment of the inventive concept, in a power system in which a power control domain (a power segment plane or a power class) (see FIG. 17B) has one power source 1 (a supply end or an input) and one or more loads (receiver ends or outputs), a control mechanism such as a detection region and protection is defined in a power grid unit separated from another power grid (an independent object) irrespective of an energy supply. On the other hand, because a power grid is generally expanded in a hierarchical structure, the power grid is physically on the same layer as a power source, but is an electrical/logical region that has correlation with the control region. In a power system having one power source (a supply end or an input) and one or more loads (receiver ends or outputs) capable of being controlled and monitored, a control mechanism such as a detection region and protection is defined in a power grid unit separated from another power grid (an independent object) irrespective of an energy supply.

The control nodes (200, 400, 600) receive power from the upper node and directly deliver the power to the lower load. For control and measurement, only one step up and down is possible. However, in obtaining a measurement value of the supply voltage, when the communication with a supply control node (the (n−1)-th layer) is not smooth, the measured value of the supply voltage may be obtained from an upper node 200 (the (n−2)-th layer) having the higher level, and the control section may be extended. Here, each of the nodes (200, 400, 600) has a means capable of delivering power, measuring a voltage, current, and power, and controlling an output. Messages are exchanged between the nodes (200, 400, 600). The gateway node 400 receives power from the upper node having functions of a feed end and a receiver end to deliver the power to the lower node or a domain and then controls a power supply to the lower node 600 as necessary.

Because the lower power grid is expanded to a power supply and a sensing/control domain in a hierarchical structure, it affects a power energy transfer flow. A plane among all power planes regard an upper plane, of which the level is higher than the plane, as a power source and receive power, and regard the lower planes (600, 600-2, 600-3) as loads and supply the power. For control and measurement, only the load of the same domain is effective. Other than a neighbor at the same level, power information of an upper domain or a lower domain having two steps or more is not subject to determination.

6. Interlock of Smart Grid

FIG. 22 illustrates a management system of a power grid to which an IoT technology is applied. Among the physical quantities capable of being measured in a system according to an embodiment of the inventive concept, electrical data for determining the abnormal symptom of an accident includes a line voltage drop ($V_{Ln}$), a line loss power ($P_{Ln}$), a line resistance ($R_L$), and an allowable maximum current ($I_{Ln(max)}$) that are pieces of information directly related to the accident. When one of the pieces of data exceeds an allowable range, an accident occurs. Accordingly, the pieces of data need to be constantly monitored. Among them, the line resistance ($R_{Lm}$) and the allowable maximum current ($I_{Ln(max)}$) are related to line equipment, and thus the line resistance ($R_{Ln}$) and the allowable maximum current ($I_{Ln(max)}$) need to be identified and maintained in advance. The dynamic measurement technology according to an embodiment of the inventive concept may estimate the line resistance ($R_{Ln}$) and the allowable maximum current ($I_{Ln(max)}$) even in an energized state in an indirect method without cutting off a line power supply even when a special measuring device is not used.

In a commercial power distribution network connected like a real web of a spider, a systematic system capable of innovatively reducing accidents caused by a line may be built by extracting and storing the line resistance ($R_{Ln}$) and the allowable maximum current ($I_{Ln(max)}$) as line information in DB, and analyzing and managing a line supply voltage ($V_S$), a load voltage ($V_L$), a load current ($I_L$), and a load power ($P_L$) as real-time information. When a network status DB such as line safety, allowable maximum current capacity ($I_{Ln(max)}$) power loss ($P_{Ln}$), or the like built by collecting information about a distribution network in real time, preemptive measures such as failure prevention may be taken, and maintenance/maintenance information may be provided.

The power grid fault detection technology fuses information communication technologies such as the conventional IoT technology and the like and grasps real-time power, a supply amount, and even the status of a power grid, thereby implementing a power grid safety map. It is possible to detect electric accidents in advance by constructing a safety network with the technology, thereby maximizing the level of safety.

When data is collected and analyzed by applying the extracted line information to multiple distribution networks based on the analysis processing information in an advanced method such as analyzing the cause of electric fire or early detection of line deterioration through the record and analysis of the loss power, quantitative information (dangerous index or safety index) about the safety of a power grid may be derived.

When information such as the number of times that a warning occurs, maintenance information, a line connection point, a branch line, and an location/address are combined, the safety may be intuitively identified by displaying not only the location information of a node, an accident situation and line-specific risk information (safety level) on a map in line management, but also the power supply status.

The safety level is displayed on a safety level map in consideration of the voltage drop ($V_{Ln}$), the line loss power ($P_{Ln}$), the line resistance ($R_{Ln}$) and the allowable maximum current ($I_{Ln(max)}$). The Line supply voltage ($V_S$), the load voltage ($V_L$), the load current ($I_L$), and the load power ($P_L$) are measured and compared in real time. When one of the measured values exceeds a specific value, a warning is provided and the power grid control center is notified of the warning. A user is notified through a warning or an SMS message. Most line accidents may be prevented by immediately shutting off the power supply to a load when it is determined that the dangerous index is high. The method is suitable for an overload. However, accidents caused by line deterioration may be recognized in advance, a practical system will be built by taking measures in advance through an advance notice. A more practical system may be built by setting a threshold in multiple steps and providing a warning for each step depending on the dangerous index.

When a smart grid is connected to an Internet cloud via a gateway 300 by using an IoT technology thus already commercialized, the connection of the smart grid may be implemented. Monitoring data for a plurality of line information may be delivered from a separate power grid information collection device included in a gateway. Here, Internet may be implemented with one of wired and wireless communication networks that provide communication of various information devices within a restricted area, or a combination of two or more among the wired and wireless communication networks. In the meantime, a transmission method standard of a network corresponding to Internet is not limited to the conventional transmission method standard. For example, all transmission method standards to be developed in the future need to be applied.

Moreover, distribution network information collected through a power grid line diagnosis technology according to an embodiment of the inventive concept is systematically stored in DB through an IoT gateway. The analysis of accident symptoms and the causes of accidents may be innovatively developed in conjunction with a big data technology, and a useful power grid management smart grid technology may be implemented.

Because the power grid control center may grasp the status of a power line in real time, it is possible to detect line faults and power grid faults due to an overload. Accordingly, failure may also be prevented by obtaining maintenance/repair information in advance.

Excessive power loss of a power grid causes an accident. The dangerous index may be quantified, and thus it is possible to reflect the dangerous index as a determining factor of an objective safety rating index.

10. Review

The inventive concept prevents accidents in advance by detecting electrical faults of a power grid and abnormal symptoms of lines and taking appropriate countermeasures. To cope with a case where there is a problem in a communication network, the inventive concept is designed to basically operate in a stand-alone mode.

It is possible to continuously monitor electrical faults and to automatically detect line faults without being affected by external conditions such as a supply voltage.

The line fault detector according to an embodiment of the inventive concept is not basically dependent on a physical location of a line, and thus the line fault detector detects a line fault between a measurement point (a power supply end) and a receiver end (a load) no matter where the line fault detector is located. The line fault detector detects abnormal symptoms in a form of an increase in a voltage drop or an increase in line loss power and a leakage current.

Electrical faults may occur at any point on a power grid. Accordingly, when the line fault detector is closely arranged, the cause of the fault may be found more effectively. In this case, an effective and sophisticated safety net may be built as each node notifies an external control center or surrounding nodes of the measured information and control information. However, each node system according to an embodiment of the inventive concept may be configured to have a relationship. However, each node operates independently (stand-alone), and thus extension structures that do not adversely affect each other are possible. Each node system is not restricted due to its high flexibility of expansion when a network is built by receiving information from a relevant node and processing only related data.

When a value measured by each measurement means and a value calculated depending on an processing/verifying algorithm based on the measured value are out of a predetermined normal range, the control device determines that an error has occurred in one or more of overloads exceeding allowable current capacity of a line or exceeding current capacity and takes follow-up measures. It is preferable that precision is raised, as each of measurement and processing at this step is synchronized by using an interrupt technology and is made in real time in parallel.

The control device may take various follow-up measures such as providing a warning for each step depending on an extent to which the reference value is out of range, and transmitting a dangerous index for cutting off power supplied to a load causing accidents, to a management center depending on the number of warnings and the dangerous index and building dangerous index map based on a database. The role of the main component may be executed by using an IoT technology in a control network such as a node of a smart grid.

When a fault state is removed, contacts are closed again to restore power to an interrupted circuit, and an error detection loop is operated.

The inventive concept may be applied to all electrical systems regardless of AC/DC technologies, and may be applied in various forms to energy conversion systems such as a transformer, a power inverter, a solar power generation system, and an energy storage system (ESS).

The spirit of the inventive concept is not limited to examples in the specification, and many modifications, substitutions, changes, and equivalents may be implemented with various modifications. Embodiments are provided as examples such that the spirit of the inventive concept may be sufficiently delivered to those skilled in the art having general knowledge. The principle of the inventive concept is not limited to embodiments described below, and may be embodied and modified in other forms. Although the description includes many features, these are intended to facilitate the description and should not be construed as limiting the scope of the inventive concept.

The inventive concept relates to a power grid line inspection (measurement) technology for detecting and preventing accidents occurring on a power transmission path or for identifying a weak defective line in advance, unlike a conventional overcurrent circuit breaker that monitors an overload, and makes it possible to take precautionary measures by preventing inappropriate use in advance or by identifying vulnerable information in advance.

The inventive concept prevents fire in a method of continuously measuring and analyzing electrical properties of a line in an energized state and controlling (cutting off) a load when the possibility of fire is high. Besides, fire may be prevented in advance by taking precautionary measures (warnings) as loss power approaches an allowable value, in a method of monitoring of line loss power of transmission and distribution lines in real time by transmitting line status information by using an IoT technology.

It is possible to build an electric fire prevention system capable of providing enhancement and systematization of fire safety management by determining in advance whether a line is normal, such as the state of a line, storing the allowable maximum current in a DB, and providing the DB. The safety information improvement DB of a line may be implemented, thereby quantifying a dangerous index/safety of a distribution line.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

INDUSTRIAL APPLICABILITY

A preemptive safety technology may dramatically reduce human casualties, property damages, and social costs caused by electric fires, and thus the commercialization thereof is highly anticipated. In addition to growth through a demand for industries of IoT-based safety-related smart device parts/products, the joint growth of IoT-based measurement technology-related industries is expected.

What is claimed is:

1. A power control system for preemptive detection and prevention of electric disasters, the system comprising:
a feed end configured to supply power;
a receiver end configured to receive the power from the feed end through a line; and
a power control device configured to:
calculate at least one of a loss power value, a leakage current value, a voltage drop value, and an impedance value based on a voltage value and a current value, which are measured at each of the feed end and the receiver end;
detect whether the line is abnormal, by comparing the calculated at least one value with a corresponding predetermined threshold and identifying a change in electrical properties; and
when it is detected that the line is abnormal, control the power supplied to the receiver end,
wherein the power control device includes:
an upper control node that obtains a supply voltage value, a supply current value, and a supply power value through the voltage value and the current value at the feed end and transmits the obtained supply voltage value, the obtained supply current value, and the obtained supply power value to a lower control node; and
the lower control node that measures the voltage value and the current value at the receiver end, obtains a load voltage value, a load current value, and a load power value, and the obtained load voltage value, the obtained load current value, and the obtained load power value to the upper control node.

2. The system of claim 1, wherein, when the load power value is received from the lower control node, the upper control node calculates a difference value between the supply power value and the load power value, as the loss power value, compares the loss power value with a predetermined power threshold, and determines whether to cut off the power supplied to the receiver end, depending on the comparison result.

3. The system of claim 2, wherein the predetermined current threshold is an allowable maximum current value,
wherein the allowable maximum current value is calculated based on Equation 1, and $$I_{Lmax} \leq \frac{\Delta V}{R_{Ln}} = \frac{\varepsilon_0 V_S}{R_{Ln}} \quad [\text{Equation 1}]$$
$$= \frac{\varepsilon_0 V_S V_L}{(V_S - V_L) R_L}$$
$$= \frac{\varepsilon_0 V_L}{\left(1 - \frac{V_L}{V_S}\right) R_L}$$
$$= \frac{\varepsilon_0 V_L}{\left(1 - \frac{V_L}{V_S}\right) R_L}$$

$$I_{Lmax} \leq \frac{\varepsilon_0 V_S I_L}{(V_S - V_L)} = \frac{\varepsilon_0 I_L}{(1 - V_L/V_S)} [A]$$

wherein, in Equation 1, $I_{Lmax}$ denotes the allowable maximum current value, $V_S$ denotes a supply voltage (the supply voltage value) of the feed end, $V_L$ denotes a load voltage (the load voltage value) of the receiver end, $I_L$ denotes the load current value, and $\varepsilon_0$ denotes an allowable voltage drop rate.

4. The system of claim 1, wherein, when the load current value is received from the lower control node, the upper control node calculates a difference value between the supply current value and the load current value as the leakage current value, compares the leakage current value with a predetermined current threshold, and determines whether to cut off the power supplied to the receiver end, depending on the comparison result.

5. The system of claim 1, wherein, when the receiver end includes a plurality of receiver ends, the lower control node includes a plurality of lower control nodes to respectively correspond to the plurality of receiver ends,
wherein, when the lower control node includes the plurality of lower control nodes, the upper control node calculates the loss power value by using a sum value obtained by summing the load power value when the load power value is received from each of the plurality of lower control nodes, and calculates the loss current value by using a sum value obtained by summing the load current value when the load current value is received from each of the plurality of lower control nodes.

6. The system of claim 5, wherein the lower control node calculates a value obtained by subtracting the load voltage value from the supply voltage value received from the upper control node, as the voltage drop value, compares the voltage drop value with a predetermined voltage drop threshold, and determines whether to cut off the power supplied from the feed end, depending on the comparison result.

7. The system of claim 6, wherein, when the receiver end includes the plurality of receiver ends, the power control device controls only power supplied to a receiver end at which the voltage drop value exceeds the predetermined voltage drop threshold.

8. The system of claim 1, wherein, when the load voltage value and the load current value are received from the lower control node, the upper control node calculates a value, which is obtained by subtracting the load voltage value from the supply voltage value, as the voltage drop value, calculates the loss power value by multiplying the voltage drop value and the load current value, compares the loss power value with a predetermined power threshold, and determines whether to cut off the power supplied to the receiver end, depending on the comparison result.

9. The system of claim 1, wherein the power control device variably and dynamically sets and applies a corresponding predetermined threshold in consideration of each allowable upper limit value.

10. The system of claim 1, wherein the power control device sets the predetermined threshold in multiple steps and provides, step by step, a warning depending on a dangerous index corresponding to each of the multiple steps or controls the power supplied to the receiver end.

11. The system of claim 1, further comprising:
a node controller configured to control a plurality of nodes,
wherein the nodes are configured to be functionally coupled and interlocked with each other through a communication means to detect defects in the power control system,
wherein the nodes are configured to set an allowable maximum leakage current and an allowable maximum voltage drop rate of a transmission line connected to them in advance,
wherein the nodes are connected to themselves through the communication means by measuring voltage and current and share power information with external nodes that receive power,
wherein the node controller is configured to:
measure a maximum current tolerance based on the allowable maximum voltage drop rate;
calculate, based on a maximum current tolerance, the voltage drop value of the line reflecting degradation characteristics, the voltage drop value of the lower node, the power loss of the transmission line, the current leakage between the transmission lines, and a maximum effective limit capacity of the node power;
set a threshold in multi-stages based on the calculated maximum effective limit capacity;
calculate, based on the line voltage drop value and line current between the plurality of nodes, an amount of heat and loss of power generated by parasitic resistance due to poor connection of the transmission line, poor contact and short circuit, and serial defects caused by deterioration of the transmission line;
detect a difference between the current value of the upper node and the current value of the lower node, and calculate the leakage current due to parallel defects in the line due to electric shock, hard short, short circuit, short circuit, insulation resistance, and dielectric breakdown between active line charging circuits;
monitor a degree of electrical defects in the power control system according to the degree to which detected results of series and parallel defects exceed each threshold set in the multi-stage or converge to each threshold;
according to the degree of electrical defects monitored, quantify a risk of the power control system as an objective number, Dangerous Index; and
determine higher probability of an accident correspondingly to higher risk, and
wherein the node controller is configured to control the power control system not to exceed the effective limit capacity by performing alarm, notification, and blocking of power supply as a risk level increases.

12. The system of claim 1,
wherein the feed end is an input terminal that supplies power to an energy converter of the power control system,
wherein the receiver end is an output end of the energy converter that supplies power to an external load,
wherein the power control device is configured to:
calculate energy conversion efficiency ($\eta$) and internal power loss, based on a first power value, fed from the input terminal to the output terminal (feed forward), and a second power value, fed back from the output terminal to the input terminal (feed back), and real-time monitor for a health of the energy converter; and
calculate a risk according to a degree to which the change in the conversion efficiency ($\eta$) converges to a preset threshold, issue an alert step by step or control the output, according to the change in the risk or the conversion efficiency ($\eta$), in order to control the conversion efficiency to be operated only below the threshold or at a maximum effective limit capacity.

13. A power control device for preemptive detection and prevention of electric disasters, the device comprising:
a communication means;
a measurement means configured to measure a voltage value and a current value at each of a feed end supplying power and a receiver end receiving the power from the feed end through a line;
a calculation means configured to:
calculate at least one of a loss power value, a leakage current value, a voltage drop value, and an impedance value based on the voltage value and the current value, which are measured at each of the feed end and the receiver end; and
detect whether the line is abnormal, by comparing the calculated at least one value with a corresponding predetermined threshold and identifying a change in electrical properties; and
a control means configured to control the power supplied to the receiver end depending on the detection result,
wherein the control means is further configured to:
when it is difficult to obtain a voltage of the feed end, regard and process a no-load voltage of the receiver end as the voltage of the feed end;
when the change in electrical properties is identified, detect a series fault and a parallel fault of a transmission line;
when the parallel fault is detected, based on a loss current value of the transmission line at the feed end, calculate a leakage current of the transmission line at the feed end, calculate a leakage and dissipated power an active wire charging circuit, and detect a cause of a disaster, which is at least one of a deduction of dielectric strength, an electric shock, a light short circuit, an ark and tracking;
when the series fault is detected, based on detection of a line voltage drop at the receiver end, calculate overload and marginal power and parasitic resistance, detect a risk factor due to deterioration, which is at least one of poor connectivity, poor contact, and short circuit defects;
when a loss power value of the transmission line and a leakage current value of the transmission line between the feed end and the receiver end exceed a threshold, control a power supply of the feed end;
when a line voltage drop value exceed the threshold, control a power supply of the receiver end;

wherein the control means is configured to:
set the predetermined threshold in multiple steps; and
provide, step by step, a warning depending on a dangerous index corresponding to each of the multiple steps or control the power supplied to the receiver end,
wherein the measurement means obtains a supply voltage value, a supply current value, and a supply power value through the voltage value and the current value at the feed end, and obtains a load voltage value, a load current value, and a load power value through the voltage value and the current value at the receiver end,
wherein the calculation means calculates a difference value between the supply power value and the load power value, as the loss power value, compares the loss power value with a predetermined power threshold, and determines whether the line is abnormal, depending on the comparison result, and
wherein, when the receiver end includes a plurality of receiver ends, the calculation means calculates a sum value by summing load power values for the plurality of receiver ends, calculates a difference value between the supply power value and the sum value, as the loss power value, compares the loss power value with the predetermined power threshold, and detects whether the line is abnormal, depending on the comparison result.

14. The device of claim 13, wherein the calculation means calculates a difference value between the supply current value and the load current value as the leakage current value, compares the leakage current value with a predetermined current threshold, and detects whether the line is abnormal, depending on the comparison result, and
wherein, when the receiver end includes a plurality of receiver ends, the calculation means calculates a sum value by summing load current values for the plurality of receiver ends, calculates a difference value between the supply current value and the sum value, as the loss current value, compares the loss current value with the predetermined current threshold, and detects whether the line is abnormal, depending on the comparison result.

15. The device of claim 13, wherein the calculation means calculates a value obtained by subtracting the load voltage value from the supply voltage value, as the voltage drop value, compares the voltage drop value with a predetermined voltage drop threshold, and determines whether to cut off the power supplied from the feed end, depending on the comparison result, and
wherein, when the receiver end includes a plurality of receiver ends, the control means controls only power supplied to a receiver end at which the voltage drop value exceeds the predetermined voltage drop threshold.

16. A power control method, performed by a power control system, for preemptive detection and prevention of electric disasters, the method comprising:
measuring a voltage value and a current value at each of a feed end supplying power and a receiver end receiving the power from the feed end through a line;
calculating, through a power control device of the power control system, at least one of a loss power value, a leakage current value, a voltage drop value, and an impedance value based on the voltage value and the current value, which are measured at each of the feed end and the receiver end;
identifying, through the power control device, a change in electrical properties by comparing the calculated at least one value with a corresponding predetermined threshold;
detecting, through the power control device, whether the line is abnormal, depending on identification result; and
when it is detected that the line is abnormal, controlling, through the power control device, the power supplied to the receiver end,
the detecting whether the line is abnormal comprises:
a first step including pre-setting an allowable maximum voltage drop rate ($\epsilon 0$), an allowable maximum leakage current value, and an allowable minimum transmission efficiency ($\eta$), which are operating limits of a transmission system, measuring, at a node equipped with measurement means at both ends of the transmission system, the values of electrical physical quantities based on voltage, current, and power, sharing the measured values with each other through communication means, measuring an allowable maximum current value (ILmax) of the transmission system, and setting each operation limit by calculating an upper limit of loss power, the maximum voltage drop, and the transmission efficiency based on the allowable maximum current value;
a second step including calculating a leakage current between electric circuits by subtracting the current value of the receiver end from the current value of the feed end, and comparing the calculated leakage current with the threshold of the leakage current, to detect an electric shock, a hard short circuit, a leakage, a short circuit, a decreasing of insulation resistance, and a dielectric breakdown of an active wire charging line;
a third step including detecting a deterioration due to increased parasitic resistance due to poor connection, poor contact, and short circuit of the transmission line by calculating the voltage drop value by subtracting the voltage value of the receiver end from the voltage value of the feed end, or by monitoring changes in parasitic resistance and parasitic impedance values of the line by dividing the voltage drop value by a node current;
a fourth step including calculating the loss power of the circuit by subtracting the power value of the receiver end from the power value of the feed end, or multiplying the voltage drop value of the transmission line by the line current, comparing the calculated loss power with the threshold of the upper limit of the loss power, and monitoring an amount of energy loss that is a cause of ignition of the transmission system,
a detecting step of a deterioration and electrical defects in the power control system by selecting one or more of the first to fourth steps to monitor a value converging on each threshold or detecting a value exceeding each threshold,
wherein the power control device includes:
an upper control node that obtains a supply voltage value, a supply current value, and a supply power value through the voltage value and the current value at the feed end and transmits the obtained supply voltage value, the obtained supply current value, and the obtained supply power value to a lower control node; and
the lower control node that measures the voltage value and the current value at the receiver end, obtains a load voltage value, a load current value, and a load power value, and the obtained load voltage value, the obtained load current value, and the obtained load power value to the upper control node.

17. The method of claim 16, wherein the identifying includes:
calculating a difference value between the supply power value and the load power value, as the loss power value and comparing the loss power value with a predetermined power threshold; and
when the receiver end includes a plurality of receiver ends, calculating a sum value by summing load power values for the plurality of receiver ends, calculating a difference value between the supply power value and the sum value, as the loss power value, and comparing the loss power value with the predetermined power threshold.

18. The method of claim 16, wherein the identifying includes:
calculating a difference value between the supply current value and the load current value as the leakage current value, and comparing the leakage current value with a predetermined current threshold; and
when the receiver end includes a plurality of receiver ends, calculating a sum value by summing load current values for the plurality of receiver ends, calculating a difference value between the supply current value and the sum value, as the loss current value, and comparing the loss current value with the predetermined current threshold.

19. The method of claim 16, wherein the identifying includes:
calculating a value obtained by subtracting the load voltage value from the supply voltage value, as the voltage drop value;
comparing the voltage drop value with a predetermined voltage drop threshold; and
determining whether to cut off the power supplied from the feed end, depending on the comparison result, and
wherein the controlling includes:
when the receiver end includes a plurality of receiver ends, controlling only power supplied to a receiver end at which the voltage drop value exceeds the predetermined voltage drop threshold.

20. The method of claim 16, further comprising:
quantitatively calculating a risk according to a degree to which the voltage drop value or voltage fluctuation rate converges to a preset voltage threshold through the power control device;
detecting in advance a symptom of an accident caused by abnormal energy loss in a transmission path based on the calculated risk through the power control device; and
performing at least one of alerts, notifications and indications of hazardous situations caused by faulty transmission lines or exceeding an allowable current capacity of transmission lines, or cutting off the supply power, to order to perform a preemptive prevention of disasters, based on previously detected results.

* * * * *